United States Patent [19]

Archer

[11] Patent Number: 4,859,921
[45] Date of Patent: Aug. 22, 1989

[54] ELECTRONIC CONTROL CIRCUITS, ELECTRONICALLY COMMUTATED MOTOR SYSTEMS, SWITCHING REGULATOR POWER SUPPLIES, AND METHODS

[75] Inventor: William R. Archer, Fort Wayne, Ind.

[73] Assignee: General Electric Company, Fort Wayne, Ind.

[21] Appl. No.: 167,574

[22] Filed: Mar. 10, 1988

[51] Int. Cl.$^4$ .............................................. H02P 5/17
[52] U.S. Cl. .................................. 318/599; 318/254; 318/138
[58] Field of Search ................. 318/138, 254, 439, 599

[56] References Cited

U.S. PATENT DOCUMENTS

| | | | |
|---|---|---|---|
| 3,152,462 | 10/1964 | Elliott et al. | 68/12 |
| 3,293,532 | 12/1966 | Dubin et al. | 321/18 |
| 3,369,381 | 2/1968 | Crane et al. | 68/12 |
| 3,531,702 | 9/1970 | Hill | 318/138 |
| 3,577,057 | 5/1971 | Dyer et al. | 318/328 |
| 3,733,540 | 5/1973 | Hawkins | 321/47 |
| 3,775,648 | 11/1973 | Brown et al. | 318/138 |
| 3,838,329 | 9/1974 | Michelet et al. | 321/2 |
| 3,898,544 | 8/1975 | Tanikoshi | 318/254 |
| 4,004,202 | 1/1977 | Davis | 318/138 |
| 4,005,347 | 1/1977 | Erdman | 318/254 |
| 4,015,182 | 3/1977 | Erdman | 318/334 |
| 4,020,361 | 4/1977 | Suelzle et al. | 307/106 |
| 4,027,215 | 5/1977 | Knight et al. | 318/341 |
| 4,161,023 | 7/1979 | Goffeau | 363/124 |
| 4,162,435 | 7/1979 | Wright | 318/138 |
| 4,169,990 | 10/1979 | Erdman | 318/138 |
| 4,208,706 | 6/1980 | Suzuki et al. | 363/26 |
| 4,250,544 | 2/1981 | Alley | 364/110 |
| 4,296,362 | 10/1981 | Beasley | 318/138 |
| 4,302,717 | 11/1981 | Olla | 323/282 |
| 4,302,807 | 11/1981 | Mentler | 363/134 |
| 4,308,577 | 12/1981 | Mentler | 363/134 |
| 4,390,826 | 6/1983 | Erdman et al. | 318/439 |
| 4,415,844 | 11/1983 | Mendenhall et al. | 318/254 |
| 4,449,079 | 5/1984 | Erdman | 318/138 |
| 4,459,519 | 7/1984 | Erdman | 318/254 |
| 4,467,261 | 8/1984 | Lamaster | 318/810 |
| 4,479,078 | 10/1984 | Kidd et al. | 318/254 |
| 4,493,017 | 1/1985 | Kammiller et al. | 363/132 |
| 4,494,049 | 1/1985 | Leitgeb | 318/138 |
| 4,494,053 | 1/1985 | Gotou | 318/254 |
| 4,495,450 | 1/1985 | Tokizaki et al. | 318/138 |
| 4,500,821 | 2/1985 | Bitting et al. | 318/254 |
| 4,513,230 | 4/1985 | Erdman | 318/254 |
| 4,520,255 | 5/1985 | Bredenkamp et al. | 219/139.1 |
| 4,528,485 | 7/1985 | Boyd | 318/138 |
| 4,532,459 | 7/1985 | Erdman et al. | 318/138 |
| 4,540,921 | 9/1985 | Boyd et al. | 318/254 |
| 4,556,827 | 12/1985 | Erdman | 318/254 |
| 4,605,865 | 8/1986 | Yuzurihara | 307/270 |
| 4,636,936 | 1/1987 | Boyd et al. | 364/148 |
| 4,642,536 | 2/1987 | Boyd et al. | 318/254 |
| 4,642,537 | 2/1987 | Young | 318/254 |
| 4,654,566 | 3/1987 | Erdman | 318/254 |
| 4,686,436 | 8/1987 | Archer | 318/138 X |
| 4,689,731 | 8/1987 | Walker et al. | 363/24 |
| 4,698,563 | 10/1987 | Ban | 318/254 |
| 4,703,235 | 10/1987 | Wisner | 318/254 |
| 4,767,948 | 8/1988 | Marquardt | 307/270 |
| 4,777,382 | 11/1988 | Reingold | 318/599 X |

Primary Examiner—Bentsu Ro
Attorney, Agent, or Firm—Ralph E. Krisher, Jr.

[57] ABSTRACT

Electronic control circuit for use with electrical load powering apparatus having a load connection, a high voltage supply connection and a common, and with an electronic switch to switch the high voltage supply connection to the load connection. The electronic switch has an input and is responsive to a voltage difference between the input and the load connection. The load connection is subject to high voltage excursions relative to the common due to the switching. The electronic control circuit includes a transformer having a primary winding and a secondary winding for providing at least one pulse output from the secondary winding, the transformer having an inherent interwinding capacitance between the primary winding and the secondary winding. A circuit connected to the secondary winding couples the pulse output from the secondary winding between the input of the electronic means and the load connection when the pulse output is present. A high voltage excursion on the load connection charges the inherent interwinding capacitance to a high voltage level when the pulse output is present. The electronic control circuit further includes circuitry for bypassing the high voltage level on the inherent interwinding capacitance of the transformer to the load connection when the pulse output and each high voltage excursion cease. An electronically commutated motor system, a switching regulator power supply and methods of operation are also disclosed.

67 Claims, 6 Drawing Sheets

ELECTRONIC CONTROL CIRCUITS, ELECTRONICALLY COMMUTATED MOTOR SYSTEMS, SWITCHING REGULATOR POWER SUPPLIES, AND METHODS

FIELD OF THE INVENTION

The present invention relates to electronic control circuits, electronically commutated motor systems, switching regulator power supplies and methods for controlling them. More specifically, the present invention relates to electronic control circuits, electronically commutated motor systems, switching regulator power supplies and methods for achieving reliable switching at relatively high voltages and with a signal transformer that has an inherent capacitance and inductance that become important considerations. Some aspects of switching at relatively high voltages are discussed in the present inventor's coassigned U.S. Pat. No. 4,686,436 issued Aug. 11, 1987, which is hereby incorporated herein by reference.

BACKGROUND OF THE INVENTION

Many forms of electrical load powering apparatus have a load connection, a voltage supply connection and a common, and electronic circuitry which switches the voltage supply connection to an electrical load. Without limiting the intended scope of applications of the invention such as switching regulator power supplies and all other applications to which the features and advantages of the invention commend it, the background of the invention is discussed in regard to a relatively specific example of powering electronically commutated motors.

While conventional brush-commutated DC motors may have numerous advantageous characteristics such as convenience of changing operational speeds and direction of rotation, it is believed that there may be disadvantages, such as brush wear, electrical noise, and radio frequency interference caused by sparking between the brushes and the segmented commutator, that may limit the applicability of such brush commutated DC motors in some fields such as the domestic appliance field. Electronically commutated motors, such as brushless DC motors and permanent magnet motors with electronic commutation, have now been developed and generally are believed to have the above discussed advantageous characteristics of the brush-commutated DC motors without many of the disadvantages thereof while also having other important advantages. Such electronically commutated motors are disclosed in coassigned Erdman U.S. Pat. Nos. 4,015,182, 4,005,347, 4,169,990, 4,449,079, 4,459,519, 4,513,230, 4,556,827, and 4,654,566 and coassigned Erdman U.S. patent application Ser. No. 015,409 filed Feb. 17, 1987, in coassigned Erdman et al. U.S. Pat. Nos. 4,390,826 and 4,532,459, in coassigned Wright U.S. Pat. No. 4,162,435, in coassigned Boyd U.S. Pat. No. 4,528,485, in coassigned Boyd et al. U.S. Pat. Nos. 4,540,921, 4,636,936 and 4,642,536, in Alley U.S. Pat. No. 4,250,544, Bitting et al. U.S. Pat. No. 4,500,821 and in Young U.S. Pat. No. 4,642,537. All of the foregoing coassigned U.S. Patents are hereby incorporated herein by reference. While the aforementioned coassigned patents and application, for instance, undoubtedly illustrated many features, it is believed that the control circuits for electronically commutated motors in general and for other applications such as switching regulator power supplies could be even further improved, as well as the methods of control utilized therein.

For example, coassigned Alley U.S. Pat. No. 4,250,544 discloses an arrangement for controlling an electronically commutated motor and is incorporated by reference. Switching of the terminals of winding stages of an electronically commutated motor is accomplished by field effect transistors therein. While such circuitry is effective and satisfactory, it is desirable in some applications contemplated for the electronically commutated motors or in power supplies, to switch relatively high voltages including voltages from generally about 100 volts, for example, up to about 400 volts or more to the winding stages. The terminals thus undergo relatively sudden high voltage excursions relative to the common, or ground connection of the electrical load powering apparatus. Such voltages make the inherent or stray capacitances and inductances of circuits for controlling the switching an important consideration. It is believed that when such higher voltages are used, or whenever the inherent capacitance or inductance is significant, the probability of false triggering, lack of reliable or positive switching, and even oscillation is increased.

Circuitry with a transformer with numerous windings for base drive of a low input impedance power transistor is illustrated in Mentler U.S. Pat. Nos. 4,302,807 and 4,308,577. Circuitry with three transformers for input drive of a low input impedance power transistor is shown in Yuzurihara U.S. Pat. No. 4,605,865.

Field effect transistors (FETs) and insulated gate transistors (IGTs) have extremely high input impedance and are voltage-controlled devices with an input capacitance which must often be taken into account. Problems of controlling transistors of this type when switching high voltage to a load under transformer drive are of continuing importance to the art, and new ways of overcoming the problems are needed.

SUMMARY OF THE INVENTION

Among the objects of the present invention are to provide improved electronic control circuits, improved electronically commutated motor systems, improved switching regulator power supplies and improved methods for controlling and operating them, for reliable switching at relatively high voltages and with a signal transformer that has an inherent capacitance and inductance that are important considerations; to provide such improved circuits, systems, power supplies and methods where a signal transformer is used, to protect from short circuits, transients and other undesired conditions; to provide such improved circuits, systems, power supplies and methods where a signal transformer is used, for reliable switching in the presence of a highly inductive load; to provide such improved circuits, systems, power supplies and methods where a signal transformer is used, for reliable switching of a solid state power switching device having a high impedance input; to provide such improved circuits, systems, power supplies and methods where a signal transformer is used, for higher speed switching of solid state power switching devices; to provide such improved circuits, systems, power supplies and methods where a signal transformer is used, for coupling switching waveforms of essentially arbitrarily long or short duration to solid state switching devices; and to provide such improved circuits, systems, power supplies and methods where a signal transformer is used, which are relatively uncomplicated and economical to manufacture or implement.

In general and in one form of the invention, an electronic control circuit is provided for use with electrical load powering apparatus having a load connection, a high voltage supply connection and a common, and with electronic means for switching the high voltage supply connection to the load connection, the electronic means having an input and being responsive to a voltage difference between the input and the load connection, the load connection being subject to high voltage excursions relative to the common due to the switching. The electronic control circuit includes a transformer having a primary winding and a secondary winding for providing at least one pulse output from the secondary winding, the transformer having an inherent interwinding capacitance between the primary winding and the secondary winding. Also included is a circuit connected to the secondary winding for coupling the pulse output from the secondary winding between the input of the electronic means and the load connection when the pulse output is present, a high voltage excursion on the load connection charging the inherent interwinding capacitance to a high voltage level when the pulse output is present. The electronic control circuit further includes means for bypassing the high voltage level on the inherent interwinding capacitance of the transformer to the load connection when the pulse output and each high voltage excursion cease, including active control means having an input and first and second control leads and means for providing a resistive path substantially free of inductance between the input of the active control means and the input of the electronic means. The active control means thereby bypasses current from the input of the electronic means to the load connection through the first and second control leads and the high voltage level is prevented from actuating the electronic means when each high voltage excursion ceases.

In general, and in another form of the invention, an electronic control circuit is provided for use in electrical load powering apparatus having a load connection, a high voltage supply connection and a common. The electronic control circuit includes a solid state power switching device having a high impedance input and control terminals connected between the high voltage supply connection and the load connection, the high impedance input having an inherent input capacitance, and the load connection being subject to high voltage excursions relative to the common due to switching. Also included is transformer means having a primary winding and a secondary winding and an inherent interwinding capacitance therebetween, active control means having an input and first and second control leads, a diode network connected to the secondary winding for providing output pulses when energized by the secondary winding, and a resistive network connected between the diode network and the high impedance input of the electronic means for switching. The active control means has its input connected to both the diode network and to the resistive network. Its first control lead is connected both to the load connection and to the diode network, and its second control lead is connected to the resistive network, so that when one of the output pulses from the diode network ceases the resistive network provides an essentially delay-free direct path from the high impedance input of the solid state power switching device to the active control means and the inherent input capacitance is discharged through the active control means. Further, when each high voltage excursion ceases the interwinding capacitance is bypassed through the active control means, whereby the high impedance input of the solid state power switching device is bypassed.

In general, and in a further form of the invention, an electronic control circuit for use in electrical load powering apparatus having a load connection, a high voltage supply connection and a common, includes a switching device having a high impedance input with an inherent input capacitance, the switching device also having control terminals connected between the high voltage supply connection and the load connection. Also included is transformer means having a primary winding and a secondary winding and an inherent interwinding capacitance therebetween, the secondary winding producing an output when the primary winding is energized, the switching device being responsive to the output from the secondary winding to switch on so that the load connection is subject to a high voltage excursion relative to the common when the switching device switches on. Further included are first and second means connected at a junction and poled serially for unidirectional conduction through either or both of the first and second means. The first means is connected to the load connection and the second means is connected to the secondary winding to charge the inherent interwinding capacitance when a high voltage excursion occurs at the load connection. The electronic control circuit still further includes active control means having a first control lead connected to the load connection, a second control lead connected to the junction of the first and second means for unidirectional conduction and a third control lead connected to the high impedance input of the switching device, and means for providing an essentially delay-free path from the high impedance input of the switching device to the active control means at the second control lead so that when an output from the secondary winding ceases the inherent input capacitance of the switching device is discharged through at least two of the control leads of the active control means, turning the switching device off, and when the high voltage excursion ceases the inherent interwinding capacitance is thereby also bypassed through the active control means.

In general and in an additional form of the invention, an electronic control circuit is provided for use in electrical load powering apparatus having a load connection, a high voltage supply connection and a common, and including electronic means for switching the high voltage supply connection to the load connection, the electronic means having an input and being responsive to a voltage difference between the input and the load connection, the load connection being subject to high voltage excursions relative to the common due to the switching. The electronic control circuit includes transformer means having a primary winding and a secondary winding for providing at least one pulse output from the secondary winding, the transformer means having an inherent interwinding capacitance between the primary winding and the secondary winding, and means connected to the secondary winding for coupling the pulse output from the secondary winding between the input of the electronic means and the load connection when the pulse output is present, a high voltage excursion on the load connection charging the inherent interwinding capacitance to a high voltage level when the pulse output is present. Further included is means for bypassing the high voltage level on the inherent interwinding capacitance of the transformer means to the load connection when the pulse output and the high voltage excursion cease, to prevent the high voltage level from actuating the electronic means, the means for bypassing having an input to which the secondary winding is capacitively connected, and the means for coupling including means, connected elsewhere to the secondary winding from the input of the means for bypassing, for unidirectional conduction in a direction opposite to a direction of discharge of current from the inherent interwinding capacitance.

Generally, and in still another form of the invention, an electronic control circuit is provided for use in electrical load powering apparatus having a load connection, a high voltage supply connection and a common, and including electronic means for switching the high voltage supply connection to the load connection, the electronic means having an input and being responsive to a voltage difference between the input and the load connection, the load connection being subject to high voltage excursions relative to the common due to the switching. The electronic control circuit includes transformer means having a primary winding and a secondary winding for providing at least one pulse output from said secondary winding, the transformer means having an inherent interwinding capacitance between the primary winding and the secondary winding, a resistive network having first, second and third connections, and full wave bridge rectification means connected across said secondary. The full wave bridge rectification means has an output connection to the first connection of the resistive network. The second connection of the resistive network couples the pulse output to the input of the electronic means to provide the voltage difference when the pulse output is present, a high voltage excursion on the load connection charging the inherent interwinding capacitance through the full wave bridge rectification means to a high voltage level when the pulse output is present. Further included is means for bypassing the high voltage level on the inherent interwinding capacitance of the transformer means to the load connection when the pulse output and each high voltage excursion cease, to prevent the high voltage level from actuating the electronic means for switching. The means for bypassing has an input directly connected to the full wave bridge rectification means and further has a first control lead to the third connection of the resistive network and a second control lead directly connected to the load connection, whereby the input of the electronic means is bypassed through the resistive network to the load connection when each high voltage excursion ceases.

Generally, and in a still further form of the invention, an electronic control circuit is provided for use in electrical load powering apparatus having a load connection, a high voltage supply connection and a common. The electronic control circuit includes a solid state power switching device having a high impedance input and control terminals connected between the high voltage supply connection and the load connection, and a transformer having a primary winding and a secondary winding for providing at least one pulse output from the secondary winding, the transformer having an inherent interwinding capacitance between the primary winding and the secondary winding. Also included is means connected to the secondary winding for coupling the pulse output from the secondary winding between the high impedance input of the solid state power switching device and the load connection when the pulse output is present, a high voltage excursion on the load connection charging the inherent interwinding capacitance to a high voltage level when the pulse output is present. Further included is means for bypassing the high voltage level on the inherent interwinding capacitance of the transformer to the load connection when the pulse output and each high voltage excursion cease, including active control means having an input and first and second control leads and means for providing a resistive path substantially free of inductance between the input of the active control means and the high impedance input of the solid state power switching device. The active control means thereby bypasses current from the high impedance input of the solid state power switching device to the load connection through the first and second control leads and the high voltage level is prevented from actuating the solid state power switching device when each high voltage excursion ceases.

Generally, and in a yet further form of the invention, an electronically commutated motor system is provided for use with electrical load powering apparatus having a high voltage supply connection and a common. The electronically commutated motor system includes an electronically commutated motor with a stationary assembly having a plurality of windig stages adapted to be selectively commutated, and rotatable means associated with the stationary assembly in selective magnetic coupling relation with the winding stages, and means for commutating the winding stages by selectively switching the winding stages at respective terminals thereof to the high voltage connection in response to command pulses. The means for commutating includes solid state power switching devices each having a high impedance input and control terminals connected between the high voltage supply connection and the terminals of the winding stages respectively, and transformers respectively corresponding to each of the solid state power switching devices, each of the transformers having a primary winding and a secondary winding for providing an output from the secondary winding in response to a respective one of the command pulses, and having an inherent interwinding capacitance between the primary winding and the secondary winding. The commutating means also includes means connected to each secondary winding for coupling the output from each secondary winding between the high impedance input of each solid state power switching device and the terminal of the winding stage to which the switching device is connected, a high voltage excursion on the terminal of any winding stage charging the inherent interwinding capacitance of a corresponding transformer to a high voltage level when the output is present. The commutating means further includes active control means each having an input and first and second control leads and means for providing resistive paths substantially free of inductance between the input of each active control means and the high impedance input of each of the solid state power switching devices respectively. The active control means is connected to bypass the high voltage level on each inherent interwinding capacitance thus charged thereby to bypass the high voltage level from the high impedance input of the corresponding solid state power switching device to the terminal of the corresponding winding stage through the first and second control leads when each high voltage excursion ceases, the high voltage level being prevented from actuating any of the solid state power switching devices when each high voltage excursion ceases.

In general, and in a still further additional form of the invention, a switching regulator power supply is provided for use with electrical load powering apparatus having a high voltage supply connection and a common. The switching regulator power supply includes a power transformer having a first winding and an output winding, a solid state power switching device having a high impedance input and control terminals connected between the high voltage supply connection and the first winding of the power transformer, the high impedance input having an inherent input capacitance, the first winding being subject to high voltage excursions relative to the common due to the switching. Also included are a signal transformer having a primary winding and a secondary winding for providing at least one pulse output from the secondary winding, the signal transformer having an inherent interwinding capacitance between the primary winding and the secondary winding, and means connected to the secondary winding for coupling the pulse output from the secondary winding between the high impedance input of the solid state power switching device and the first winding of the power transformer when the pulse output is present, a high voltage excursion on the first winding charging the inherent interwinding capacitance to a high voltage level when the pulse output is present. Further included is means for bypassing the high voltage level on the inherent interwinding capacitance of the signal transformer to the first winding of the power transformer when the pulse output and each high voltage excursion cease, including active control means having an input and first and second control leads and means for providing a resistive path substantially free of inductance between the input of the active control means and the high impedance input of the solid state power switching device. The active control means thereby bypasses current from the high impedance input of the solid state power switching device to the first winding through the first and second control leads and the high voltage level is prevented from actuating the solid state power switching device when each high voltage excursion ceases. The switching regulator power supply additionally includes means connected to the output winding of the power transformer for deriving an output voltage of the switching regulator power supply, means for detecting a difference between the output voltage and a predetermined value to which the output voltage is to be regulated, and means for generating a pulse width modulated series of pulses for energizing the primary winding of the signal transformer as a function of the difference so detected to reduce the difference detected.

Generally, a method form of the invention includes the steps of producing at least one pulse output from a secondary winding of a transformer having a primary winding and a secondary winding and an inherent interwinding capacitance between the primary winding and the secondary winding and coupling the pulse output from the secondary winding between the input of the electronic means and the load connection when the pulse output is present, a high voltage excursion on the load connection charging the inherent interwinding capacitance to a high voltage level when the pulse output is present. A further step provides an electrical signal substantially free of inductive delay from the input of the electronic means to an active control means so that the active control means bypasses current from the input of the electronic means to the load connection and the high voltage level is prevented from actuating the electronic means when each high voltage excursion ceases.

Generally, and in another method form of the invention, a control method includes the steps of producing a bipolar pulse output from a transformer having a primary winding and a secondary winding and an inherent interwinding capacitance between the primary winding and the secondary winding, processing the bipolar pulse output through a diode network to produce an electrical control signal, and resistively coupling the electrical control signal from the diode network to the high impedance input of the electronic means for switching, thereby charging its inherent input capacitance and switching on, a high voltage excursion on the load connection charging the inherent interwinding capacitance of the transformer to a high voltage level. Further method steps discharge the inherent input capacitance substantially free of inductive delay when the bipolar pulse output from the transformer ceases, and bypass the high voltage level on the inherent interwinding capacitance to the load connection when each high voltage excursion ceases, whereby the high impedance input of the electronic means is bypassed when each high voltage excursion ceases.

Generally, a further method form of the invention for operating an electronically commutated motor includes the steps of commutating the winding stages by selectively switching the winding stages at respective terminals thereof to the high voltage connection with high impedance input solid state switching devices in response to pulses, each high impedance input having an inherent input capacitance, and producing the pulses rectified from transformers having a primary winding and a secondary winding and an inherent interwinding capacitance between the primary winding and the secondary winding, a high voltage excursion due to the switching on the terminal of any winding stage charging the inherent interwinding capacitance of a corresponding transformer to a high voltage level. Further steps discharge each inherent input capacitance substantially free of inductive delay when each pulse so rectified ceases and bypass each interwinding capacitance thus charged to the terminal of the corresponding winding stage to avoid actuating the high impedance input of each corresponding solid state power switching device when each high voltage excursion ceases.

Other objects and features will be in part apparent and in part pointed out hereinafter.

BRIEF DESCRIPTION OF THE DRAWINGS

Corresponding reference characters indicate corresponding parts throughout the several views of the drawings.

The exemplifications set out herein illustrate preferred embodiments of the invention in one form thereof, and such exemplifications are not to be construed as limiting the scope of the invention in any manner.

DETAILED DESCRIPTION OF PREFERRED EMBODIMENTS

Figure 1:
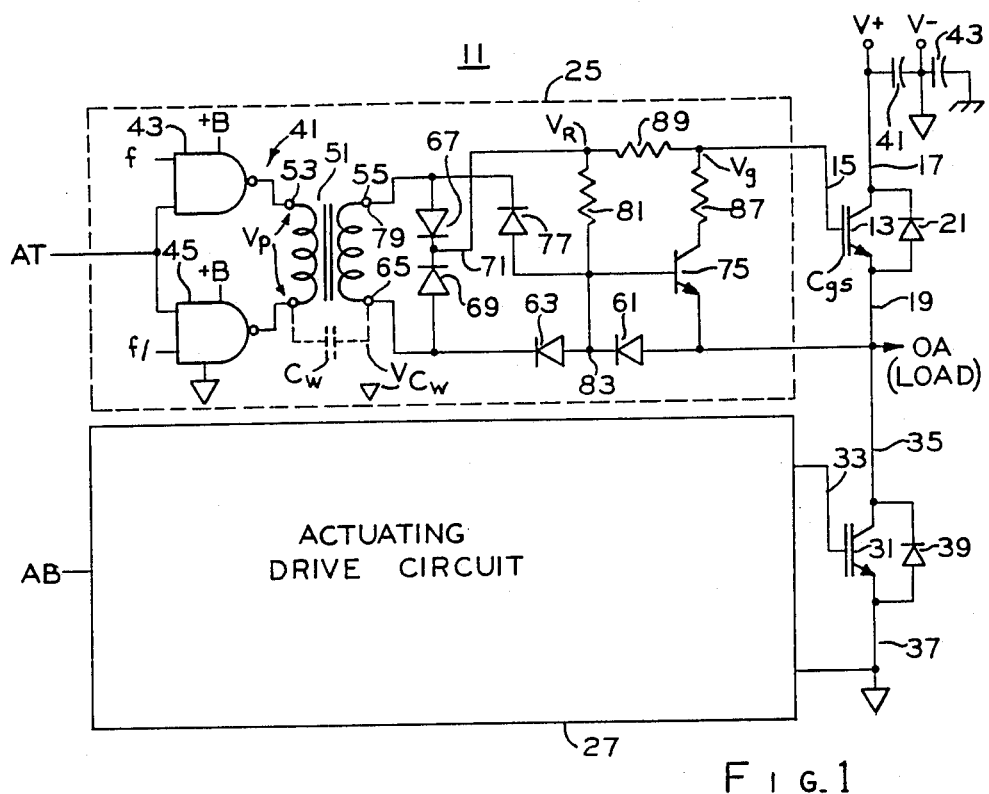
FIG. 1 is a schematic diagram of an electronic control circuit of the invention for switching high voltage (HV) direct current to a load according to methods of the invention, and including a second electronic control circuit of the invention block form.

Referring now to the drawings, and more particularly to FIG. 1, a system 11 for controlling switching of power supply terminals V+ and V− to a load connection OA has a first solid state power switching device 13 connected between power supply terminal V+ and load connection OA. Power switching device 13 has a high impedance input 15 (a gate for instance) and terminals 17 and 19 connected between the V+ terminal and the load connection OA respectively. Power switching device 13 is suitably an insulated gate transistor (IGT) having a gate, collector and emitter as shown or a field effect transistor (FET) having a gate, a source and a drain. A freewheeling diode 21 is connected with its cathode to terminal V+ and its anode to terminal 19. When a positive potential is applied between terminals 15 and 19 of switching device 13, the device 13 is made conductive and effectively connects terminal V+ to the load connection OA.

A drive circuit 25 is supplied with a switching waveform AT and correspondingly supplies an electrical control signal between input terminal 15 and load connection OA. The switching waveform AT is applied from a separate circuit and for example can be a pulse width modulated (PWM) signal for controlling drive to a load in a regulated power supply or for controlling drive to a brushless motor or other desired load. Although switching waveform AT is supplied with respect to a common, the output of drive circuit 25 is provided as a voltage between terminals 15 and 19 which are subject to high voltage excursions on the order of more than 100 volts or as much as 350–400 volts and more. Switching waveform AT is suitably supplied from a separate low voltage integrated circuit which could be adversely affected by high voltage excursions if it were not for circuit 25.

An additional actuating drive circuit 27 of identical electrical circuit construction as circuit 25 is provided with another different low voltage low frequency PWM waveform AB. The output of drive circuit 27 is connected to a power switching device 31 which has a high impedance input terminal 33 and switching terminals 35 and 37. Switching terminal 35 is connected to load connection OA and terminal 37 is connected to common and power terminal V−. Drive circuit 27 applies a control voltage to terminals 33 and 37 of device 31. A free wheeling diode 39 is connected with its cathode to the load connection OA and its anode to terminal 37 of device 31. Interference suppressing capacitors 41 and 43 are connected so that capacitor 41 is connected between terminals V+ and V− and capacitor 43 is connected between terminal V− and a chassis or earth ground if one is available.

Switching device 31 and actuating drive circuit 27 are examples of use of a second solid state power switching device having an input and control terminals connected between the load connection and the common and means connected to the input of the second solid state power switching device for actuating or making conductive the second solid state power switching device.

The preferred embodiment of FIG. 1 provides a low-cost high-performance DC coupled, isolated, transformer drive circuit for the gate drive of IGTs and FETs to control particularly the upper device in a half-bridge or full bridge power IGT/FET switching control circuit.

When building so-called totem pole or half-bridge power converters and inverters it is useful to provide a level translator which interfaces a low-level control signal, such as AT, to a high voltage level power switching device 13. In some high voltage (HV) systems it is noted that the gate-source terminals of the power switch are subjected to very rapid excursions from essentially common (ground) to 350–400 volts, for example. This occurs not only due to switching the upper power switch 13 on and off, but also to switching lower device 31 on and off. In other words, the process of actuating, activating, or otherwise making either device 13 or 31 conductive or of deactuating, deactivating or otherwise making device 13 or 31 nonconductive can introduce these high voltage excursions, level changes or transients.

The exemplary circuits and methods herein disclosed advantageously account for these high voltage excursions, and allow the input switching waveform (e.g. AT) and only such waveform to control the state of its switching device (e.g. 13) regardless of the transient behavior. Inherent non-ideal characteristics of devices and components must be considered in order to provide switching to the load terminal OA in a positive manner which accurately reflects and is controlled by the low frequency control waveforms provided to input connections AT and AB. One of these non-ideal characteristics is an input capacitance Cgs of power switching device 13 between its terminals 15 and 19. This capacitance typically lies in a range from about 400 picofarads to 1800 picofarads for a typical IGTs which can switch on the order of 50 to 100 amperes with a 15-20 volt gate drive. 5-10 volts of gate drive typically is sufficient for turning on presently available FET power switching devices.

Figure 2A:
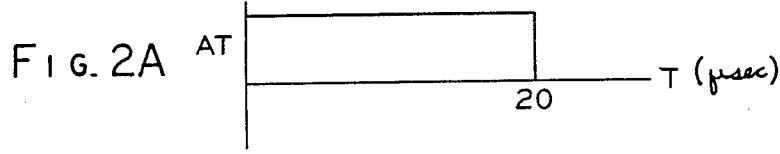
FIGS. 2A, 2B, 2C and 2D are a set of voltage-versus-time diagrams of waveforms illustrating operations of an electronic control circuit of FIG. 1 according to a method of the invention.

As shown in FIG. 2A, switching waveform AT is a rectangular pulse on the order of 20 kiloHertz with a pulse length on the order of 10-100 microseconds with about 20 microseconds shown. In FIG. 2A a single pulse of the low frequency control wave form AT is shown having a logic high level for 20 milliseconds and then assuming a logic low level until the high is resumed later It is applied to a carrier-based switching circuit 41 having two NAND CMOS (complementary metal oxide semiconductor) logic gates 43 and 45 with outputs directly connected to a signal transformer 51 at opposite ends of its primary winding 53. An input terminal from each NAND gate 43 and 45 is connected to receive switching waveform AT. An additional input terminal of NAND gate 43 is connected to a clock source providing a square wave clock signal f on the order of 1-5 megaHertz. The second NAND gate 45 has an additional input terminal to receive the logical complement of the clock waveform which is designated f/. Each NAND gate 43 and 45 is supplied with a low voltage logic level power supply +B, and is alternately enabled by the clock pulses from a clock circuit (not shown), which is of conventional design.

Figure 2B:
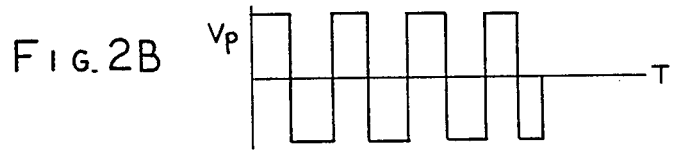

The clock signal f is a high frequency carrier, suitably in the one (1) megaHertz to five (5) megaHertz range for instance. NAND gates 43 and 45 form a pair of gated inverters. That is, when waveform AT is high, the output of NAND gate 43 is f/, the complement of f, and the output of NAND gate 45 is essentially the same as clock signal f. This applies a square wave primary voltage Vp which is a bipolar square signal with an essentially zero average (DC level=0) as shown in FIG. 2B (pulses widened for clarity relative to the actual time scale) with positive pulses equal in height to CMOS logic level and also negative pulses equal in magnitude or depth to CMOS logic level. The peak-to-peak value of the pulses of FIG. 2B is advantageously twice the CMOS logic level, providing efficient energization of transformer 51. In FIG. 2B the bipolar voltage waveform Vp continues for 20 milliseconds, which is the length of the high pulse of waveform AT of FIG. 2A. Then in FIG. 2B the bipolar waveform ceases until the waveform of FIG. 2A again assumes a logic high level.

When switching waveform AT is low, the outputs of both NAND gates 43 and 45 go high and there is no signal applied to primary winding 53 because the voltage Vp across primary winding 53 is zero. When waveform AT is high, transformer 51 is driven at a megaHertz rate in accordance with the bipolar pulses of FIG. 2B.

Transformer 51 provides DC isolation between its primary winding 53 and secondary winding 55. Each winding 53 and 55 is suitably wound around the same ferrite magnetizable core with sufficient insulation to easily withstand high voltage on the order of 400 volts and more. Transformer 51 is a non-ideal transformer which exhibits an interwinding capacitance Cw between primary winding 53 and secondary winding 55 as shown in dashed technique. It is to be understood that the interwinding capacitance is more accurately regarded as a capacitance distributed over the entire primary and secondary windings, and it is shown as a single dashed capacitor in FIG. 1 only for convenience of drawing.

In an example of transformer 51 a 1:1 turns ratio with 15 turns in the primary winding and 15 turns in the secondary winding is utilized and the interwinding capacitance Cw is approximately 5 picofarads. The wire size of the windings is uncritical. Because sufficient insulation must be provided to DC-isolate the primary from the secondary, the magnetic coupling between the primary and secondary is not complete and the primary winding has a self inductance on the order of one millihenry at one megaHertz. This means that the primary draws on the order of 7.5 milliamperes peak current which is well within the capacity of typical complementary metal oxide semiconductor (CMOS) devices for the NAND gates 43 and 45.

The self inductance current is a triangular wave which varies between peaks and troughs according to the equations 15 volts divided by 1 millihenry=15 amperes per millisecond;

15 amperes per millisecond times×500 nanoseconds (½ cycle at 1 megaHertz)=7.5 milliamperes.

Referring again to FIG. 1 the voltage across secondary winding 55 of transformer 51 is approximately the same as the primary voltage as shown in FIG. 2B. However, the voltage level of the secondary winding 55 as a whole with respect to common is subject to abrupt changes depending on high voltage excursions at load connection OA, which cause jumps in voltage on the secondary winding 55 between zero volts (common) and a high voltage level due to the switching by power switching devices 13 and 31.

For example, when switching device 31 is off and sitching device 13 is turned on, the voltage of the load connection OA jumps from zero to illustratively 400 volts. Almost concurrently, the voltage level of secondary winding 55 abruptly rises to a high voltage level $V_{C_w}$ of approximately 400 volts due to charging of the inherent interwinding capacitance Cw, while the DC level of primary winding 53 remains near common relatively speaking. The interwinding capacitance Cw is charged with the high voltage intentionally from the load connection OA through a pair of serially connected diodes 61 and 63. The anode of diode 61 is connected to load connection OA. The cathode of diode 61 is connected to the anode of diode 63. The cathode of diode 63 is connected to one end 65 of secondary winding 55. In this way, diodes 61 and 63 act as an example of a means for unidirectional conduction of current between the load connection and the transformer to charge the interwinding capacitance of the transformer when one of the high voltage excursions occurs.

Also, diodes 61 and 63 constitute an example of first and second means connected at a junction serially for unidirectional conduction through either or both of the first and second means, the first means being connected to the load connection and the second means being connected to the secondary winding to charge the interwinding capacitance when a high voltage excursion occurs at the load connection. Diode 63 also is an example of means connected from the secondary winding to the input of an active control means. Diode 63 is poled for unidirectional conduction in a direction opposite to a direction of discharge of current from the inherent interwinding capacitance Cw.

In addition a further pair of diodes 67 and 69 is connected across the secondary 55 of transformer 51. Diodes 67 and 69 are identically poled with respect to secondary winding 55 and oppositely poled with respect to each other so that their cathodes are connected together at a junction 71 and their anodes are connected to opposite terminals or ends of the secondary winding 55.

An NPN control transistor 75 has a base connected to the anode of a diode 77 which in turn has its cathode connected to secondary winding 55 at a terminal or end 79 opposite to end 65. A voltage $V_R$ is developed across a resistor 81 connected between junction 71 of diodes 67 and 69 and a junction 83 of diodes 61 and 63. The junction 83 of diodes 61 and 63 is directly connected to the base of transistor 75 and to resistor 81 in this preferred embodiment. A value of resistor 81 is typically between 5 and 15 kilohms (K ohms).

Transistor 75 has its emitter directly connected to load connection OA and has a collector connected to input 15 of switching device 13 by a resistor 87. Also another resistor 89 is connected between input 15 of device 13 and junction 71 of diodes 67 and 69. Resistor 89 is on the order of a few hundred ohms in one preferred embodiment for example, and resistor 87 is on the order of a hundred ohms or less. The voltage between junctions 71 and 83 is designated $V_R$. The gate voltage between terminals 15 and 19 of device 13 is designated $V_g$.

When waveform AT is high, transformer 51 secondary output (same waveshape as in FIG. 2B) is rectified by diodes 67, 69, 63 and 77 (rectified waveform in FIG. 2C) and applied to a resistive network of the hereinabove-described resistors 81, 89 and 87 at first and second connections across resistor 81. Resistor 89 is a current limiting resistor which sets the rate of rise of the gate voltage (charging of Cgs). Normally the values of resistor 89 and inherent input capacitance Cgs are selected to allow fast enough turn on of switching device 13 to minimize switching losses, yet slow enough to control electromagnetic interference (EMI) and noise generation. As long as waveform AT of FIG. 2A stays high, the gate drive to switching device 13 is sustained, and essentially direct current DC coupling is achieved. A high frequency ripple (shown as V-shaped gaps in FIG. 2C) due to rectifying the megaHertz carrier of FIG. 2B is suitably removed by the combination of resistor 89 and the inherent input capacitance Cgs, with Cgs economically doing double duty as a filter capacitance. The remaining ripple appears as small notches of about 0.5 volt in the gate voltage Vg waveform of FIG. 2D.

The diodes shown in FIG. 1, for instance, collectively form a diode network and the resistors in FIG. 1 collectively form a resistive network. For purposes of the present disclosure a "diode network" has at least two diodes and no other elements besides diodes (inherent, stray and insubstantial resistances and reactances excepted), and each diode is connected directly to at least one other diode in the network. Similarly, a resistive network has at least two resistive elements and no other elements besides resistive elements (inherent, stray and insubstantial reactances excepted), and each resistive element is connected directly to at least one other resistive element in the network. The diode network and resistive network together act as an example of a means connected to the secondary winding for coupling the pulse output from the secondary winding between the input of the electronic means for switching and the load connection when the pulse output is present. A high voltage excursion on the load connection charges the inherent interwinding capacitance to a high voltage level when the pulse output is present. Diode 61 also acts as a means responsive to the pulse output of the secondary winding for temporarily preventing or disabling operation of means for bypassing exemplified by transistor 75.

When waveform AT goes low in FIG. 2A, the drive to primary winding 53 of transformer 51 is removed and the voltage on resistor 81 goes toward zero. The voltage between input 15 and load connection OA, due to electric charge on inherent input capacitance Cgs, causes a current to flow (substantially free of inductive or capacitive delay) from Cgs through resistors 89 and 81 and through the base-emitter circuit of control transistor 75. This current turns transistor 75 on, which rapidly discharges and bypasses Cgs through resistor 87 and the collector-emitter path of transistor 75 to the load connection OA. Thus, when waveform AT goes low in FIG. 2A, there is a rapid and immediate discharge of inherent input capacitance Cgs which turns switching device 13 off so that it is nonconductive. Resistor 87 is used to limit the discharge current.

The circuit 25 of FIG. 1 DC-drives device 13, isolates the drive via transformer 51 and controls the turn-on time and the turn-off time independently for device 13 by resistors 89 and 87 respectively.

A high noise immunity is necessary for circuit 25 during the rapid voltage changes that occur at the onset of a high voltage excursion at load connection OA and when such an excursion ceases. The rate of voltage change at load connection OA is its derivative dv/dt. Some designs of transformer 51 have lower inherent interwinding capacitance Cw than others, but Cw generally is a significant consideration and in high voltage applications becomes a major problem which the preferred embodiments overcome.

When the load connection OA, or power lead to the load, is switched to 400 volts, for example, inherent interwinding capacitance Cw is deliberately charged to about the same 400 volts. In this way, potential differences in the circuit 25 between the secondary winding 55 and input 15 are kept small, allowing inexpensive electronic components to be used for the diodes and for the control transistor 75. The transformer 51 is efficiently used as a voltage isolation device since it can inexpensively provide isolation for the full amount of the high voltage level to which its inherent input capacitance is charged.

Figure 3:
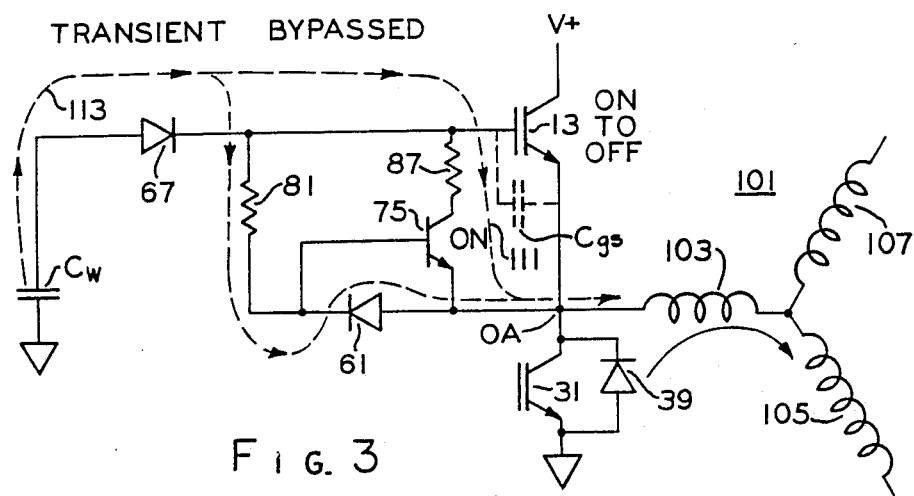
FIG. 3 is a simplified schematic diagram of FIG. 1 for showing an example of transient bypassing by circuitry and methods of the invention.
Figure 4:
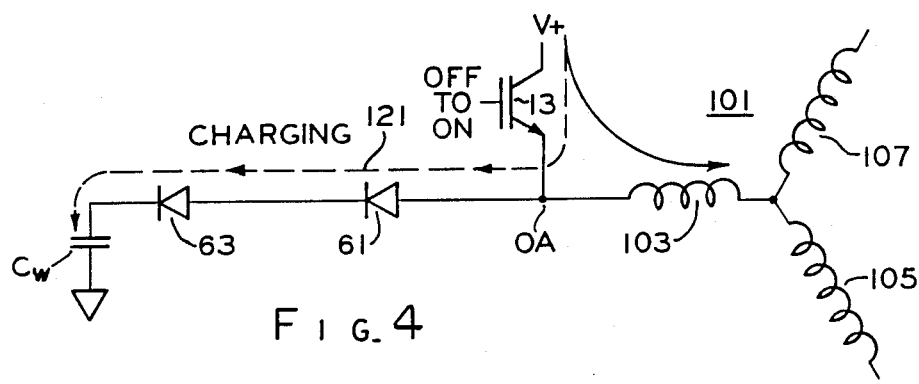
FIG. 4. is another simplified schematic diagram of FIG. 1 for showing an example of a circumstance of charging an inherent interwinding capacitance Cw by circuitry and methods of the invention.
Figure 5:
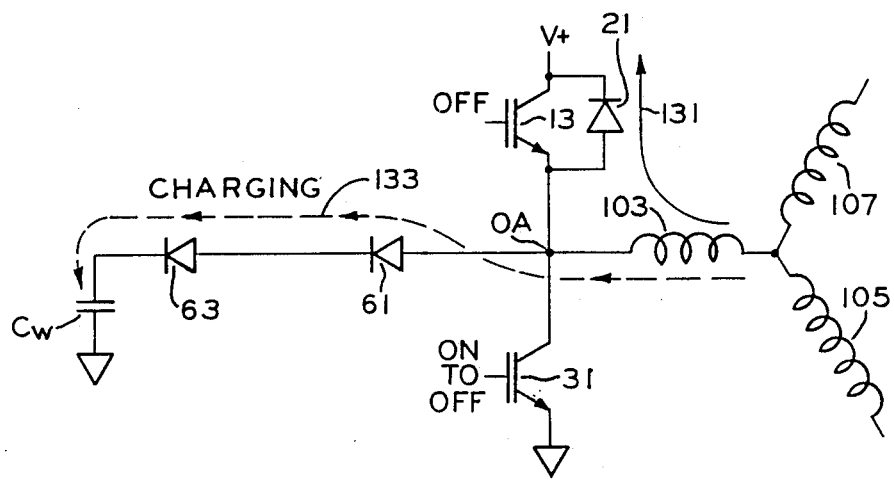
FIG. 5 is another simplified schematic diagram of FIG. 1 for showing an example of a different circumstance of charging an inherent interwinding capacitance Cw by circuitry and methods of the invention.

Charging and discharging or bypassing of capacitance Cw occurs by a flow of current as shown by dashed arrows 113, 121 and 133 of FIGS. 3–5. This current is termed a common-mode current because it can be allowed to flow in or out of either end 79 or 65 of secondary winding 55, or both ends at once through diodes 67 and 69 to resistors 89 and 87 and through resistor 81 and transistor 75. An inherent inductance L of the secondary winding 55 and the resistance R1 of its discharge path also become important factors at the high voltages and higher levels of discharge current. The time constant of this discharge path is L/R1, which introduces a degree of delay which is advantageously minimized according to the preferred embodiments and methods of operation by providing a direct resistive path from input lead 15 of device 13 to control transistor 75 to turn the transistor 75 on as soon as possible when waveform AT goes low. As a result, secondary winding 55 is excluded from the resistive path and prevented from introducing a delay, in turning control transistor 75 on in the first instance.

Figure 9:
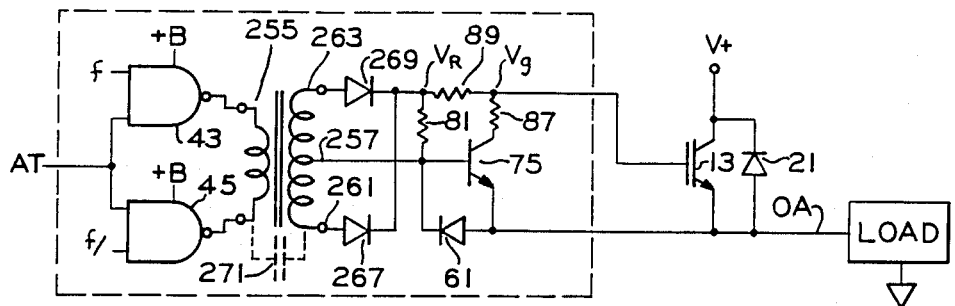
FIG. 9 is schematic diagram of an alternative form of an electronic control circuit according to the invention.
Figure 10:
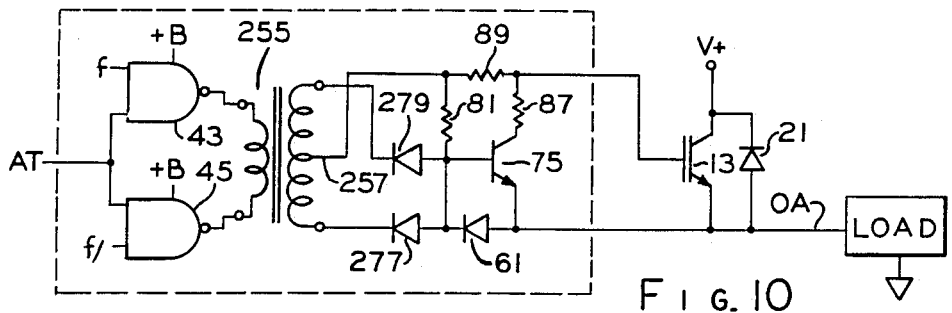
FIG. 10 is a schematic diagram of another alternative form of an electronic control circuit according to the invention.

Furthermore, the use of two back-to-back diodes 67 and 69 in FIGS. 1, 9 and 10 and center-tapping in FIGS. 9 and 10 discharges the capacitance Cw in a balanced manner so that oppositely directed currents are believed to flow in the secondary winding of the transformer in these embodiments producing opposing inductively induced voltages in the winding which effectively cancel these voltages and most of the delay that they could otherwise produce. This canceling effect is believed to further speed the discharge of capacitance Cw. Not only do these preferred embodiments provide examples of means for bypassing including means for providing a substantially delay-free resistive path substantially free of inductance between the active control means (e.g. transistor 75) and the high impedance input of the switching device 13, but also they provide examples of means for providing between the load connection and both ends of the secondary winding a substantially electrically symmetrical path from the secondary winding to the load connection for bypassing current that is discharging from the inherent interwinding capacitance of the transformer. The balance or symmetry considerations just discussed are consistent with the observation that the discharge current is in fact a common mode current, i.e. that it is equally available from both ends of the secondary due to the electrical symmetry of the distributed interwinding capacitance and also of the circuitry with respect to the secondary winding.

If the common mode current 113 of FIG. 3 leaving inherent interwinding capacitance Cw were to flow through resistor 89 and charge inherent input capacitance Cgs without any bypassing, it would turn on switching device 13 or keep it on. This would be a false turn-on because waveform AT is low in FIG. 2A when the interwinding capacitance Cw is discharging. However, in the preferred embodiments, an increase in the voltage of inherent input capacitance Cgs is of the positive polarity which causes transistor 75 to cnnduct. Transistor 75 and resistor 87 constitute a far lower impedance for current through resistor 89, than does the high impedance (substantially capacitive) of the gate of switching device 13. Consequently most of the common mode current 113 flowing from secondary winding 55 flows through transistor 75. Transistor 75 and resistor 87 effectively bypass the input of device 13 because their low impedance develops relatively little voltage across the input of device 13 when the common mode current 113 is present. In effect input capacitance Cgs is solidly clamped to zero volts relative to the load connection OA.

Figure 11:
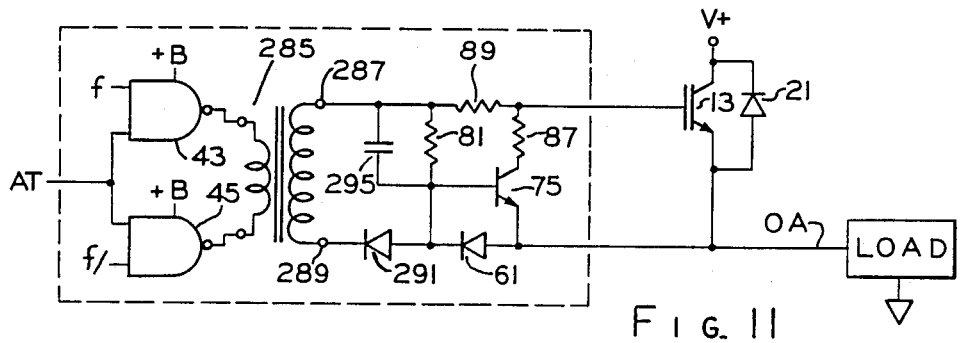
FIG. 11 is a schematic diagram of still another alternative form of an electronic control circuit according to the invention.
Figure 12:
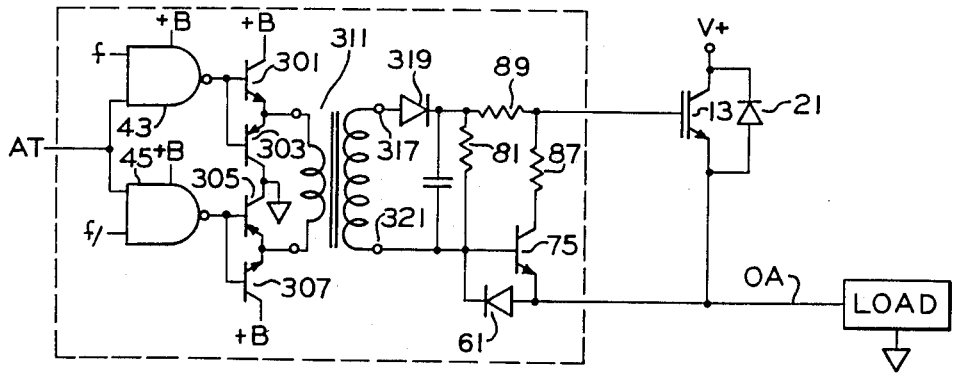
FIG. 12 is a schematic diagram of yet another alternative form of an electronic control circuit according to the invention.

The reverse direction of common mode current 121 of FIG. 4 or current 133 of FIG. 5 in charging the inherent interwinding capacitance Cw through diode 61 advantageously does not turn switching device 13 on, nor does it falsely turn switching device 13 off. Diode 61 provides a very low impedance charging path through diodes 63 and 77 directly to both ends 65 and 79 of secondary winding 55 in FIG. 1. Similarly, in FIG. 10 diode 61 provides a very low impedance charging path through diodes 277 and 279 directly to both ends of the secondary winding of transformer 255. In FIG. 9 diode 61 provides a very low impedance charging path directly to the center tap 257 of the transformer. In FIG. 11 diode 61 provides a very low impedance charging path through diode 291 directly to end 289 of the secondary winding of the transformer. In FIG. 12 diode 61 provides a very low impedance charging path directly to end 321 of the transformer. In each case, diode 61 alone or with one or more other diodes effectively and advantageously acts as an example of further means for bypassing the high impedance input of the switching device when the inherent interwinding capacitance of the secondary winding is being charged when a high voltage excursion occurs and for preventing the switching device from being turned off when a high voltage excursion occurs. Together the diode network, resistive network and active control means such as transistor 75 act as an example of a means for isolating the high impedance input of the switching device from any substantial transient potential differences due to inherent energy storage parameters of the transformer and of the switching device when each high voltage excursion occurs and when each high voltage excursion ceases thereby to prevent the switching device from being spuriously changed in its state of nonconduction or conduction when a high voltage excursion occurs and ceases respectively. The switching device is caused to faithfully reflect the state of a switching waveform (e.g. AT) in its state of nonconduction or conduction.

Advantageously, the preferred embodiments in the Figures each act as a total drive system which automatically rejects the potentially troublesome interwinding capacitance of the signal transformer (e.g. 51, 255, 285 or 311 in the various Figures) thus allowing fast switching of devices 13 and 31. The signal transformer is small and economical, with an uncomplicated two-winding arrangement, and thus compatible with the high carrier frequency of the clock pulses f. The primary winding is solely associated with a single secondary winding and no additional windings are needed in the embodiments shown. Low cost winding methods are feasible because potentially troublesome transient behavior due to the inherent interwinding capacitance is bypassed, compensated, balanced, offset and obviated.

Control transistor 75 is an NPN transistor with an emitter connected to the load connection, a collector resistively connected to the input of the electronic means, and a base as a suitable input of active control means connected also to sense the high voltage level on the inherent interwinding capacitance. In a preferred embodiment, transistor 75 is an inexpensive low power device that need only conduct 50–100 milliamperes peak current, for one example. Advantageously, the transistor 75 is rendered conductive by a predetermined polarity referenced to the load connection rather than referenced to the input 15 of the switching device 13. Also, a junction field effect transistor (JFET) or other active solid state device can be used as an active control means instead of an NPN transistor according to the principles discussed.

Control transistor 75 constitutes an example of active device means having a first electrode directly and ohmically connected to the load connection, a second electrode connected to the junction of first and second means for unidirectional conduction and a third electrode resistively connected to the second electrode and resistively connected to the input terminal of a high impedance input switching device. The active control means exemplified by transistor 75 is only responsive to a predetermined voltage polarity between its input and the first control lead. The secondary winding is connected between the input and the second control lead of the active control means so that the pulse output is prevented from actuating the active control means (i.e., from making it conductive) and is coupled instead to the electronic means for switching. Diode 61 acts as a unidirectional conduction means connected between the load connection and the input of the active control means and poled to develop a disabling voltage opposite to the predetermined voltage polarity when a high voltage excursion occurs.

Resistors 89 and 81 together with resistor 87 and control transistor 75 constitute an example of a means for providing an essentially delay free path from the inherent capacitance of high impedance input switching means to the active control means at a second electrode so that when a normal output across the secondary winding ceases both the inherent capacitance of the high impedance input switching means and the interwinding capacitance of the transformer means are discharged and the high impedance control device positively switches. Put another way, resistors 89 and 81 together with resistor 87 and control transistor 75 constitute an example of a means for bypassing the high voltage level on the inherent interwinding capacitance of the transformer to the load connection when the pulse output and each high voltage excursion cease, including active control means having an input and first and second control leads and means for providing a resistive path substantially free of inductance between the input of the active control means and the input of the electronic means, the active control means thereby bypassing current from the input of the electronic means to the load connection through the first and second control leads and the high voltage level being prevented from actuating the electronic means when each high voltage excursion ceases.

Put still another way, when one of the output pulses from the diode network ceases, the resistive network provides an essentially delay-free direct path from the high impedance input of the solid state power switching device to the active control means and the inherent input capacitance is discharged through the active control means. The inherent input capacitance is discharged through at least two of the control leads of the active control means, turning the switching device off, and when the high voltage excursion ceases the inherent interwinding capacitance is thereby also bypassed through the active control means, and the high impedance input of the solid state power switching device is thus fully bypassed.

Diodes 67, 69, 63 and 77 of FIG. 1 also can be viewed as a full wave bridge rectifier or rectification means connected across the secondary winding 55. The rectification means has a first output (e.g. at junction 83) connected directly to the base input of active control means, and a second output (e.g. at junction 71) connected to the resistive network. The active control means has its input and at least one of its control leads directly connected to the resistive network (e.g. to resistors 81 and 87 respectively). The resistive network has a further connection for the input 15 of the electronic means for switching (e.g. device 13).

Figure 2C:
Figure 2D:
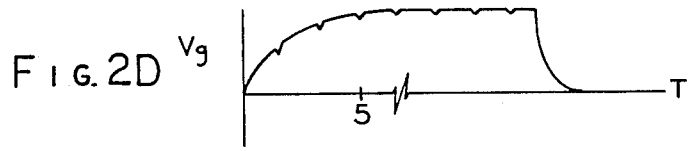

Advantageously and as shown in FIG. 2C, the bipolar voltage of FIG. 2B is full wave rectified to produce a series of very high frequency pulses that as full wave rectified very nearly approximate a continuous low frequency DC voltage pulse like that shown in FIG. 2A, recovering same. The full wave rectified voltage of FIG. 2C appears as voltage $V_R$ and is applied through resistor 89 to the high impedance input terminal 15 of switching device 13. Then as shown in FIG. 2D the series resistance substantially provided by resistor 89 together with the input capacitance Cgs of device 13 provide an RC charging waveform on the leading edge of the gate voltage Vg of FIG. 2D which essentially rises to a full drive voltage within approximately 5 microseconds or less, for example, and remains there throughout the duration of the control waveform AT in FIG. 2A. For instance, a value of RC time constant for resistor 89 of 500 ohms and inherent input capacitance Cgs of 1000 picofarads is 0.5 nanoseconds, and this time constant can be changed at will by varying resistor 89 in value. Then upon the cessation of control waveform AT (after 20 microseconds for example) the inherent capacitance Cgs is rapidly discharged with essentially negligible delay through resistor 87 and control transistor 75 to the load connection. Device 13 is positively switched off regardless of the voltage at the load connection at the time and regardless of any high voltage excursion which may be occurring, and when the excursion ceases inherent interwinding capacitance Cw is bypassed and discharges to common with negligible delay.

In the discharging process control transistor 75 is immediately turned on and maintained on in an effectively delay-free manner due to the voltage Vg on the inherent capacitance Cgs of device 13 discharging through resistor 89 through resistor 81 and into the base emitter path of control transistor 75. Advantageously in this preferred embodiment there is no delaying element such as a series inductance or a parallel capacitance interposed between the inherent capacitance Cgs of device 13 and the discharge network constituted by resistors 81, 89 and 87 together with control transistor 75. Specifically, the secondary winding of transformer 51 is independent of and excluded from the discharge path from the gate lead 15 to the load connection through transistor 75. Furthermore, the diodes of the full wave rectifying circuit 67, 69, 77 and 63 prevent the discharge of current from the gate of device 13 into the secondary winding 55.

Although the full wave rectifying diodes as just mentioned prevent discharge back into the secondary winding 55, they provide paths of conduction from secondary winding 55 to the load connection for bypassing any high voltage on the interwinding capacitance Cw of transformer 51. In this way control transistor 75 rapidly and effectively bypasses the input capacitance Cgs of device 13 preventing inadvertent energization of device 13 after the control voltage at point AT has ceased in FIG. 2A. Therefore in FIG. 2D the very rapid and steep discharge curve is executed which effectively and positively terminates the gate voltage Vg at the high impedance input of device 13 thereby turning device 13 off.

FIG. 3 shows this effective and advantageous discharge and bypassing process which is importantly provided by the embodiment of FIG. 1. Load connection OA is initially at 400 volts when power switching device 13 is turned from on to off. Regardless of the state of conduction of device 31 freewheeling diode 39 conducts if the load such as an electronically commutated motor 101 is inductive. In such case a winding stage 103 (by the inductive fly-wheel effect) attempts to maintain the load current flowing in winding stage 103 which then is conducted to either or both of winding stages 105 and 107 in the Y-connected electronically commutated motor 101. Diode 39 is conducting, so the voltage of load connection OA is one diode drop below common. The input capacitance of device 13 discharges to the load connection as shown by arrow 111, through resistor 87 and the transistor 75. The interwinding capacitance Cw is simultaneously discharged as shown by an arrow 113 through forward conducting diode 67 (as well as 69). Part of the Cw discharge current passes through base resistor 81 thence into the base of control transistor 75 and out the emitter of control transistor 75 to the load connection OA and to common. Most of the Cw discharge current passes through resistors 89 and 87 and thence through transistor 75 to the load connection and to common. (The diode 61 is reversed biased at this time and plays no part.) In this way the discharge of inherent capacitances Cgs and Cw is effectively accomplished, and their different discharge paths (Cgs to OA; Cw to common) share resistor 87 and transistor 75.

A typical high impedance switching FET or IGT has a turnoff voltage $Vg = Vto$ on the order of 2 volts. For effective bypassing, a discharge current Id from interwinding capacitance Cw through resistance R of the bypassing circuit comprised of resistor 87 and transistor 81 collector-emitter path should be less than a current value that develops voltage Vto. Hence, the product RId should be less than Vto. The discharge current Id is also the product of the value of capacitance Cw with the derivative of its voltage $dv/dt$, (i.e., $Id = (dv/dt)Cw$). Solving for resistance R yields the inequality that R should be less than the ratio $Vto/(dv/dt\ Cw)$ as a bypassing condition. The skilled worker then selects the appropriate component values to achieve the bypassing effect. In one preferred embodiment a resistance 87 value of 100 ohms or less is satisfactory for bypassing FETs and IGTs. The voltage derivative $dv/dt$ is related to the load inductance, maximum load current and interelectrode capacitances of the power switch 13, among other variables, and suitably is measured or estimated for the particular application. A typical value of the voltage derivative is 4 volts per nanosecond.

In FIG. 4 a charging mode of the circuit of FIG. 1 is illustrated. Power switching device 13 switches from off to on. Current flows from the high voltage terminal V+ of an external power source through power switching device 13 into winding 103 of the Y-connected electronically commutated motor 101. Load connection OA suddenly rises to 400 volts for example and a charging current 121 shown by a dashed line also simultaneously flows through the serially connected unidirectional conduction diodes 61 and 63 (and 77). It is to be understood that FIGS. 3–5 are simplified to illustrate the action of drive circuit 25 of FIG. 1 with inactive or nonconducting devices for the most part being omitted for clarity to more effectively illustrate the modes of a preferred embodiment of the invention in different phases of its operation.

FIG. 5 illustrates a still further mode by which the interwinding capacitance Cw is charged through the two unidirectional conduction devices 61 and 63 even though the upper power switching device 13 is off at the time. In this case the lower switching device 31 has been on and is suddenly switched off. The inductance of winding 103 in the load for example has been flowing toward load terminal OA. Because of the flywheel effect of the inductance of winding 103 it acts to keep the current flowing. The voltage at load terminal OA suddenly rises in an abrupt high voltage excursion so that current 131 flows upward through freewheeling diode 21 into the positive high voltage terminal V+ thereby returning energy to the power supply. Power switching device 13 is off at this time. Because of the sudden rise in voltage however a charging current 133 as shown by a dashed line also flows from the high voltage terminal OA through diode 61 and diode 63 (and 77) into the interwinding capacitance Cw.

Figure 6:
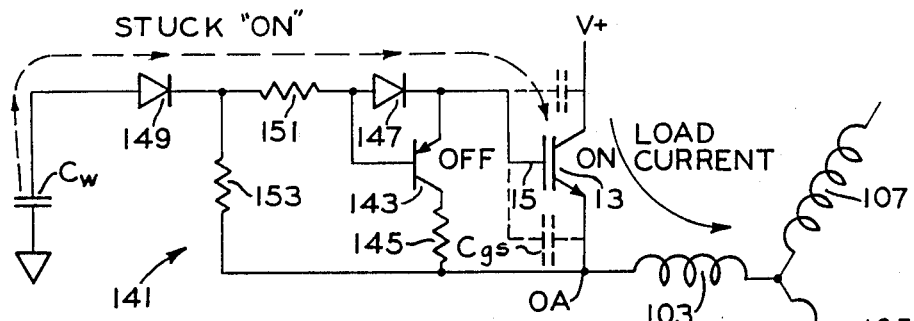
FIG. 6 is a simplified schematic diagram of a different circuit from that of FIG. 1, FIG. 6 showing an example of disadvantageous operation of a solid state power switching device with a signal transformer, which disadvantageous operation is avoided by circuitry and methods of the invention.

FIG. 6 shows an example of less preferable operation of an alternative apparatus which has a transformer drive circuit 141 for the power switching device 13 and the motor windings 103, 105 and 107. In this circuit 141 a PNP transistor 143 has its emitter connected to the high impedance input 15 of power switching device 13. The collector of PNP transistor 143 is connected by a resistor 145 to the load connection OA. A diode 147 has its cathode connected to the emitter of transistor 143 and its anode connected to the base of transistor 143. The inherent interwinding capacitance Cw of a transformer (not shown) is connected through a diode 149 and a resistor 151 in series to the base of transistor 143. A resistor 153 connects diode 149 cathode to the load connection OA.

In less preferable circuit 141, when drive to the base of power switching device 13 is supposed to cease at the end of control pulse AT of FIG. 2A, high voltage on the interwinding capacitance Cw disadvantageously is coupled through diodes 149 and 147 to the high impedance input of the power switching device 13. Therefore even if the power switching device 13 had temporarily turned off or begun to turn off, causing the load connection OA to drop in voltage, the interwinding capacitance Cw would switch device 13 back on, or would keep it "stuck" on. Instability and even oscillatory behavior of the power switching device 13 are other disadvantageous circuit contingencies in circuit 141 of FIG. 6. These disadvantageous features are among some of the objects of the invention to overcome as described elsewhere herein.

Figure 7:
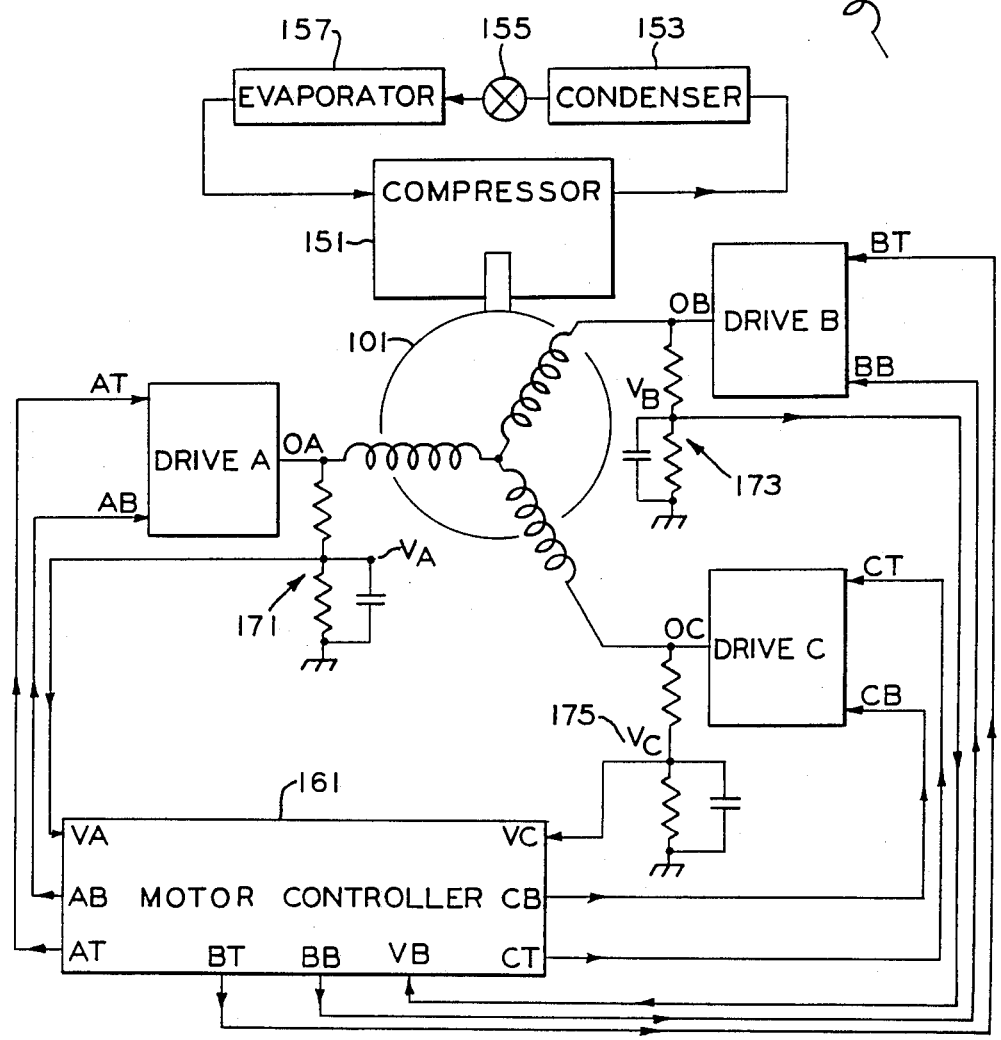
FIG. 7 is a partially block, partially schematic diagram of an electronically commutated motor system in a heat transfer system, with electronic control circuits, or drives, of the invention operating according to methods of the invention for switching high voltage (HV) direct current to an electronically commutated motor.

FIG. 7 shows a preferred embodiment of an electronically commutated motor system. All of the circuitry of FIG. 1 (circuits 25 and 27 and the power switching devices 13 and 31 and diodes 21 and 39) is regarded as a drive A of FIG. 7.

In FIG. 1 circuit 27 includes a second transformer having a primary winding and a secondary winding for providing at least one pulse output, and means for coupling the pulse output from the secondary winding of the second transformer between the input of a second solid state power switching device and common. The electronic control circuit further includes clock circuit means for producing pulses having a repetition rate and first and second means for switching the pulses at a switching rate less than the repetition rate to the primary windings of the first and second transformers (e.g. of circuits 25 and 27 respectively) in accordance with first and second switching waveforms respectively.

Returning to FIG. 7, three duplicates of all of the circuitry in FIG. 1 are provided as drives A, B and C of FIG. 7. The load connection designated OA in FIG. 1 is identically marked as terminal OA for drive A of FIG. 7. Load connections of the identical circuitry of drive B and drive C are correspondingly marked as load connections OB and OC. Load connections OA, OB and OC are connected to the winding stage terminals of Y-connected electronically commutated motor 101 of FIG. 7.

Motor 101 illustratively drives an 8.5 horsepower compressor 151. Compressor 151 supplies refrigerant at a high side pressure to a condenser 153 which then feeds a thermal expansion valve (TEV) 155 that in turn supplies an evaporator 157 which returns the refrigerant to compressor 151.

Electronically commutated motor 101 includes a stationary assembly having a plurality of winding stages adapted to be selectively commutated, and rotatable means associated with the stationary assembly in selective magnetic coupling relation with the winding stages, as described in coassigned U.S. Pat. No. 4,528,485 incorporated by reference herein, for example.

When the winding stages 103, 105 and 107 are energized or powered either singly or in pairs in a temporal sequence, three sets of eight magnetic poles are established that provide a radial magnetic field that moves clockwise or counterclockwise around the bore of the stationary assembly depending on the preselected sequence or order in which the stages are powered. This moving field intersects with the flux field of a permanent magnet rotor as rotatable means to cause the rotor to rotate relative to the stationary assembly in a desired direction to develop a torque which is a direct function of the intensities or strengths of the magnetic fields. Further, while electronically commutated motor 101 is discussed as shown herein for purposes of disclosure, it is contemplated that other such motors of different constructions, having 2, 4, 6, etc. poles and having 2, 3, 4 or more winding stages and/or different winding arrangements may be utilized in one or another embodiment of the invention to meet at least some of the objects thereof.

Motor 101 is commutated by circuitry for commutating the winding stages by selectively switching the winding stages at the respective terminals OA, OB and OC thereof to the high voltage connection V+ in response to command pulses. The drive A of FIG. 7 has two inputs AT and AB for the top and bottom A inputs corresponding to FIG. 1. These are supplied by a motor controller 161 which has top and bottom outputs not only for drive A (AT, AB) but also drive B (BT, BB) and drive C (CT, CB). These outputs are provided in the manner of the above cited Bitting et al. U.S. Pat. No. 4,500,821 which is incorporated herein by reference. The motor controller utilizes back EMF position sensing from the terminals of the Y-connected electronically commutated motor 101. Sensing circuits 171, 173 and 175 for drives A, B and C respectively are connected to the winding stage terminals OA, OB and OC as voltage dividers with low side RF bypass condensers to produce position sensing voltages VA, VB and VC respectively that are returned to corresponding inputs of motor controller 161. Sensing circuits 171, 173 and 175 and motor controller 161 act as respective examples of position sensing means for producing electrical position signals representing the position of the rotatable means, and means for generating the command pulses in response to the electrical position signals from the position sensing means.

In this way an effective and reliable electronically commutated motor system is provided. The motor system electronics includes solid state power switching devices each having a high impedance input and control terminals connected between the high voltage supply connection and the terminals of the winding stages respectively. In each drive A, B and C, transformers respectively correspond to each of the solid state power switching devices. Each of the transformers has a primary winding and a secondary winding for providing an output from the secondary winding in response to a respective one of the command pulses, and an inherent interwinding capacitance is present between the primary winding and the secondary winding. Circuitry connected to each secondary winding couples the output from each secondary winding between the high impedance input of each solid state power switching device and the terminal of the winding stage to which the switching device is connected. A high voltage excursion on the terminal of any winding stage charges the inherent interwinding capacitance of a corresponding transformer to a high voltage level when the output is present. Active control means each have an input and first and second control leads and circuitry provides resistive paths substantially free of inductance between the input of each active control means and the high impedance input of each of the solid state power switching devices respectively. The active control means are connected to bypass the high voltage level on each inherent interwinding capacitance thus charged thereby to bypass the high voltage level from the high impedance input of the corresponding solid state power switching device to the terminal of the corresponding winding stage through the first and second control leads when each high voltage excursion ceases. In this way, the high voltage level is prevented from actuating any of the solid state power switching devices when each high voltage excursion ceases.

This electronically commutated motor system of FIG. 7 is suitable for refrigeration, air conditioning, heat pump and other heat transfer or other applications requiring economic and reliable drive. It is contemplated that the electronically commutated motor systems of the present invention may also be applied in all applications to which their advantages commend them, such as automotive applications, household and industrial applications, including fluid transfer applications such as heat transfer or refrigeration systems and air moving fan motors, automotive blower motors and other applications too numerous to specifically detail.

Figure 8:
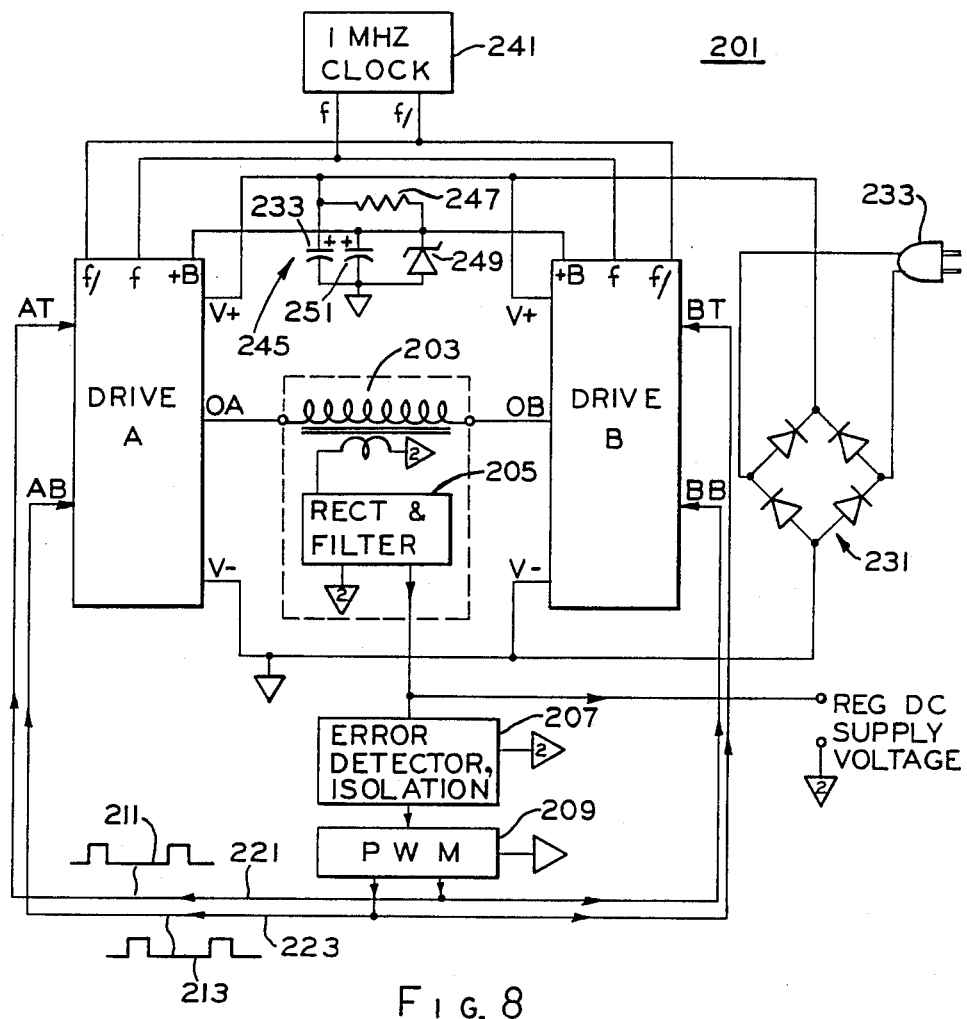
FIG. 8 is a partially block, partially schematic diagram of a switching regulator power supply of the invention including electronic control circuits and solid state switching devices of the invention operating according to methods of the invention.

In FIG. 8 a switching regulator power supply 201 has identical drives designated Drive A and Drive B, each of which are identical to the circuitry shown in FIG. 1, are connected with their load connections OA and OB connected to opposite sides of a first winding 203.1 of a power transformer 203 of the switching regulator. A low voltage second winding 203.2 of the switching regulator feeds a rectifier and filter circuit 205 of conventional full wave rectifier and capacitive filter type, for example. Circuit 205 is an example of a means connected to the output winding of the power transformer for deriving an output voltage of the switching regulator power supply. The output of circuit 205 is connected to terminals at which the regulated DC supply voltage output of the power supply is made available. For regulation purposes, this output voltage is also supplied to an error detector 207 and PWM circuit 209 of conventional type. Error detector 207 is an example of a means for detecting a difference between the output voltage and a predetermined value to which the output voltage is to be regulated. (Ground triangle symbols marked with a "2" inside them indicate an output common which is DC-isolated (by optocoupling for instance) from the drive commons shown as unmarked ground triangle symbols.) The output of PWM circuit 209 produces pulses of variable width 211 and 213 on corresponding lines 221 and 223. PWM circuit 209 is an example of a means for generating a pulse width modulated series of pulses for energizing the primary winding of the signal transformer (e.g. transformer 51 of FIG. 1) as a function of the difference so detected to reduce the difference detected. Lines 221 and 223 are connected to the inputs AT and AB respectively of drive A and to inputs BB and BT respectively of drive B so that drive A and drive B alternately energize their load connections to drive the power transformer 203 with a bipolar voltage. The energy for drives A and B is supplied by a full wave rectifier bridge 231 which obtains power from commercial mains through plug 233 and supplies high voltage supply terminals V+ and V− of each of drives A and B. Capacitive filtering is provided by a capacitor 233. A one megaHertz clock circuit 241 of conventional construction provides outputs f and f/ to corresponding inputs of drive A and drive B. The clock circuit is an example of a clock circuit means for producing pulses having a repetition rate and the NAND gates 43 and 45 of FIG. 1 together are an example of a means for switching the pulses at a switching rate less than the repetition rate to the primary windings of signal transformers in drives A and B in response to PWM circuit 209. A low voltage power supply subsection 245 has a voltage dropping resistor 247, 15 volt Zener diode 249 and filter capacitor 251 to provide a nominally +15 volt logic supply to terminals +B of drive A and drive B.

FIGS. 9–12 illustrate some additional embodiments of drive circuitry which can be substituted for drive circuit 25 of FIG. 1. Corresponding devices in each of these FIGS. 9–12 which are unchanged compared to FIG. 1 are maintained with corresponding reference numerals.

In FIG. 9 NAND gates 43 and 45 feed the primary winding of a transformer 255 having a two to one turns ratio between secondary and primary. The secondary winding is center tapped at a center tap 257. Center tap 257 is connected directly to the junction of resistor 81, cathode of diode 61 and base of control NPN control transistor 75. Ends 261 and 263 of the secondary winding of transformer 255 are connected to the anodes of diodes 267 and 269 respectively. The cathodes of diodes 267 and 269 are connected together to the junction of resistors 81 and 89 and produce a full wave rectified voltage $V_R$ as shown in FIG. 2C to essentially recover the switching waveform AT of FIG. 2A.

The circuit of FIG. 9 advantageously provides a direct delay-free path from the high impedance input of switching device 13 through resistors 89, 81 and 87 through control transistor 75 to the load connection OA. An inherent interwinding capacitance 271 distributed across the windings of transformer 255 is discharged in a balanced symmetrical manner through the base of control transistor 75 as well as through diodes 269 and 267 to efficiently and very rapidly discharge the interwinding capacitance when necessary. Similarly the interwinding capacitance is charged from load connection OA through diode 61 which has its cathode directly connected to center tap 257.

In FIG. 10 the full wave rectification is accomplished with the same transformer 255 except that the center tap 257 is connected to the junction of resistors 81 and 89. In other words, the secondary winding has a tap directly connected to means for providing an essentially delay-free path such as a passive and resistive electrical network at a point electrically distinct from the second control lead of the active control means. The ends 261 and 263 of the secondary winding are in this embodiment connected to the cathodes of two diodes 277 and 279. The anodes of both identically poled diodes 277 and 279 are both connected to the cathode of diode 61 and to the base of control transistor 75. In FIG. 10 the connections of resistors 81, 89 and 87 with control transistor 75 and power switching device 13 are the same as in FIGS. 9 and 1. Diode 61 and diode 277 form a pair of unidirectionally conductive means which are directly connected at their junction to the base of control transistor 75.

In FIG. 11 NAND gates 43 and 45 are connected to the primary winding of a transformer 285 which has more turns in its secondary than in its primary. One end 287 of the secondary winding is connected to the junction of resistors 81 and 89 and another end 289 of the secondary winding of transformer 285 is connected to the cathode of a diode 291 the anode of which is serially connected with the cathode of diode 61 at a junction. The junction between diode 61 and diode 291 is directly connected to the base of transistor 75. A capacitor 295 of approximately 100 picofarads in value is connected between end 287 of the secondary winding and the base of control transistor 75. The connections of resistors 81, 89, 87, control transistor 75 and power switching device 13 are otherwise the same as in FIG. 9. Diode 291 and capacitor 295 form a half wave rectifier and filter with sufficient filtering to drive and hold power switching device 13 on between adjacent half cycles of the one megaHertz clock pulses. Capacitor 295 also acts as a speedup capacitor for discharging and bypassing purposes.

In FIGS. 11 and 12 the secondary winding is capacitively connected to the input of the active control means and the input of the active control means is also separately connected to the secondary winding to sense the high voltage level on the inherent interwinding capacitance.

In FIG. 12 NAND gates 43 and 45 have their outputs connected to the bases of four driver transistors 301, 303, 305 and 307. NAND gate 43 output is connected to the bases of driver transistors 301 and 303. NAND gate 45 output is connected to the bases of driver transistors 305 and 307. The emitters of transistors 301 and 303 are connected to a first side of a primary of a transformer 311 and the emitters of transistors 305 and 307 are both connected to the opposite side of the primary. The collectors of transistors 301 and 307 are both connected to 15 volts +B low voltage supply. The secondary winding of transformer 311 has approximately twice as many turns as the primary winding of the transformer and a secondary terminal 317 is connected to the anode of a diode 319 the cathode of which is connected to the junction of resistors 81 and 89. A capacitor 323 of approximately 100 picofarads value is connected between the cathode of diode 319 and the opposite terminal 321 of the secondary winding of transformer 311. The base of control transistor 75 and the cathode of the diode 61 are together connected directly to the secondary winding terminal 321. Otherwise the connections of resistors 81, 89 and 87 and control transistor 75 and switching device 13 are the same as those in FIG. 9.

In some embodiments, a capacitor analogous to capacitor 295 of FIG. 11 is advantageously connected across resistor 81 in FIGS. 1, 9 and 10. This capacitor even further removes the ripple and notches in FIGS. 2C and 2D and provides a speedup capacitor action for discharge and bypassing purposes. Also, use of such capacitor permits some savings in transformer 51 of FIGS. 9 and 10, which can have less perfectly balanced and less tightly coupled halves provided in its secondary winding. In addition, the capacitor eliminates noise interference which could be magnetically induced into the higher impedance of resistor 81 from any nearby high-current conductor which might be present in the load or on a printed circuit or in other circuitry of a particular application.

Figure 13:
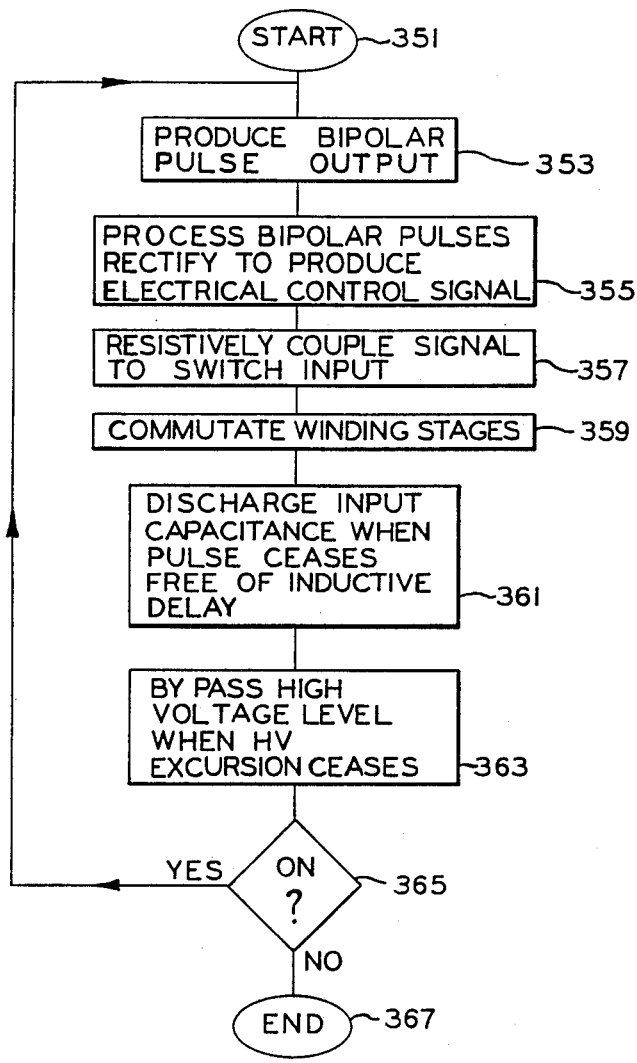
FIG. 13 is a flow diagram of method steps according to methods of the invention.

FIG. 13 shows steps of some preferred methods of operating the control circuitry, electronically commutated motor system and switching regulator power supply of the earlier Figures.

In FIG. 13, operations begin at a START 351 and proceed to a step 353 to produce a bipolar pulse output from a transformer having a primary winding and a secondary winding with an inherent interwinding capacitance between the primary winding and the secondary winding.

Next in a step 355, the bipolar pulses are processed, such as through a diode network, so that they are rectified to produce or recover an electrical control signal.

In a succeeding step 357, the bipolar pulse output thus processed to produce the electrical control signal is resistively coupled between the high impedance input of a solid state switching device and the load connection. This operation charges the inherent input capacitance of the solid state switching device, switching it on. At this time a high voltage excursion on the load connection charges the inherent interwinding capacitance of the transformer to a high voltage level.

Next in a step 359, the winding stages are commutated. In the switching regulator power supply of FIG. 8, the first winding 203.1 of the power transformer 203 acts as a single winding stage. In the electronically commutated motor system of FIG. 7, the three winding stages of the motor 101 are commutated by selectively switching the winding stages at respective terminals thereof to the high voltage connection with high impedance input solid state switching devices in response to pulses.

In a following step 361, the input capacitance of each solid state switching device which is turned off by commutation is discharged substantially free of inductive delay, when the bipolar pulses so rectified cease to produce the electrical control signal.

A further step 363 bypasses the high voltage level on the interwinding capacitance of the transformer when each high voltage excursion on the load connection ceases, to bypass the high impedance input of the electronic means for switching when each high voltage excursion ceases.

In the motor system each interwinding capacitance thus charged is bypassed to the terminal of the corresponding winding stage to avoid actuating the high impedance input of each corresponding solid state power switching device when each high voltage excursion ceases. For example, an electrical signal representing the charged input capacitance of each solid state switching device is provided substantially free of inductive delay from the input of the switching device to an active control means so that the active control means bypasses current from the input of the switching device to the load connection and the high voltage level is prevented from actuating the electronic means when each high voltage excursion ceases. In this way each interwinding capacitance is bypassed to avoid activating the high impedance input of each corresponding solid state power switching device when each high voltage excursion ceases.

Operations continue repeatedly by looping back to step 353 if the circuit, system or power supply remains on in a step 365. If no longer on, then operations terminate at an END 367.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. For use with electrical load powering apparatus having a load connection, a high voltage supply connection and a common, and with electronic means for switching the high voltage supply connection to the load connection, the electronic means having an input and being responsive to a voltage difference between the input and the load connection, the load connection being subject to high voltage excursions relative to the common due to the switching, an electronic control circuit comprising:

a transformer having a primary winding and a secondary winding for providing at least one pulse output from said secondary winding, said transformer having an inherent interwinding capacitance between said primary winding and said secondary winding;

means connected to said secondary winding for coupling the pulse output from said secondary winding between the input of the electronic means and the load connection when the pulse output is present, a high voltage excursion on the load connection charging the inherent interwinding capacitance to a high voltage level when the pulse output is present; and means for bypassing the high voltage level on the inherent interwinding capacitance of said transformer to the load connection when the pulse output and each high voltage excursion cease, including active control means having an input and first and second control leads and means for providing a resistive path substantially free of inductance between the input of said active control means and the input of the electronic means, said active control means thereby bypassing current from the input of the electronic means to the load connection through the first and second control leads and the high voltage level being prevented from actuating the electronic means when each high voltage excursion ceases.

2. An electronic control circuit as set forth in claim 1 wherein said means for providing a resistive path includes a resistive network and said means for coupling includes full wave bridge rectification means connected across said secondary winding, said full wave bridge rectification means having a first output connected directly to said input of said active control means and a second output connected to said resistive network, said active control means having its input and at least one of its control leads directly connected to said resistive network, said resistive network having a further connection for the input of the electronic means.

3. An electronic control circuit as set forth in claim 1 wherein said secondary winding is capacitively connected to said input of said active control means and said means for coupling includes means connected elsewhere from said secondary winding to said input of said active control means for unidirectional conduction in a direction opposite to a direction of discharge of current from the inherent interwinding capacitance.

4. An electronic control circuit as set forth in claim 1 wherein said input of said active control means is also separately connected to said secondary winding to sense the high voltage level of the inherent interwinding capacitance.

5. An electronic control circuit as set forth in claim 1 further comprising means responsive to the pulse output of said secondary winding for temporarily preventing operation of said means for bypassing.

6. An electronic control circuit as set forth in claim 1 wherein said active control means is only responsive to a predetermined voltage polarity between its input and said first control lead, and said secondary winding is connected between said input and said second control lead of said active control means so that the pulse output is prevented from actuating said active control means and is coupled instead to the electronic means.

7. An electronic control circuit as set forth in claim 1 wherein said active control means is only responsive to a predetermined voltage polarity between its input and said first control lead and further comprising unidirectional conduction means connected between the load connection and the input of said active control means and poled to develop a voltage opposite to the predetermined voltage polarity when a high voltage excursion occurs.

8. An electronic control circuit as set forth in claim 1 wherein said means for providing a resistive path includes a resistive network and said means for coupling includes a diode network connected between said secondary winding and said resistive network, said active control means having one of its control leads connected both to the load connection and to said diode network.

9. An electronic control circuit as set forth in claim 1 wherein said active control means includes a transistor having an emitter connected to the load connection, a collector resistively connected to the input of the electronic means, and a base as the input of said active control means connected also to sense the high voltage level on the inherent interwinding capacitance.

10. An electronic control circuit as set forth in claim 9 wherein said transistor is an NPN transistor.

11. An electronic control circuit as set forth in claim 1 wherein said secondary winding is directly connected to the input of said active control means and said means for coupling includes means connected elsewhere to said secondary winding for half wave rectifying the pulse output for the input of the electronic means.

12. An electronic control circuit as set forth in claim 1 wherein said means for coupling includes means for half wave rectifying and filtering the pulse output of said secondary winding.

13. An electronic control circuit as set forth in claim 1 wherein said means for coupling includes means for full wave rectifying the pulse output of said secondary winding.

14. An electronic control circuit as set forth in claim 1 wherein said secondary winding of said transformer has two ends and said means for coupling includes a pair of identically poled diodes respectively connected to each end of said secondary winding.

15. An electronic control circuit as set forth in claim 14 wherein said secondary winding has a center tap connected to said input of said active control means, and said pair of diodes are connected to said means for providing a resistive path.

16. An electronic control circuit as set forth in claim 14 wherein said pair of diodes are connected together and to the input of said active control means, and said secondary winding has a center tap connected to said means for providing a resistive path.

17. An electronic control circuit as set forth in claim 1 wherein said means for coupling includes means for charging the inherent interwinding capacitance from the load connection when the pulse output occurs.

18. An electronic control circuit as set forth in claim 17 wherein said means for charging includes unidirectional conduction means connected for conduction from the load connection to said transformer.

19. An electronic control circuit as set forth in claim 1 further comprising a pair of logic gates connected to opposite ends of said primary winding of said transformer.

20. An electronic control circuit as set forth in claim 19 wherein said pair of logic gates are CMOS with outputs directly connected to said primary winding.

21. An electronic control circuit as set forth in claim 1 further comprising clock circuit means for producing pulses having a repetition rate and means for switching the pulses at a switching rate less than the repetition rate to said primary winding.

22. An electronic control circuit as set forth in claim 21 wherein said means for switching is responsive to a switching waveform input thereto and wherein said means for coupling includes full wave rectification means for recovering said switching waveform substantially free of said pulses from said clock circuit means.

23. An electronic control circuit as set forth in claim 22 wherein said means for switching includes a pair of logic gates connected to opposite ends of said primary winding, the logic gates each having an input for said switching waveform and a second input connected to said clock circuit means for alternately enabling said pair of logic gates.

24. An electronic control circuit for use in electrical load powering apparatus having a load connection, a high voltage supply connection and a common, the electronic control circuit comprising:
a solid state power switching device having a high impedance input and control terminals connected between the high voltage supply connection and the load connection, the high impedance input having an inherent input capacitance, the load connection being subject to high voltage extrusions relative to the common due to switching;
transformer means having a primary winding and a secondary winding and an inherent interwinding capacitance therebetween;
active control means having an input and first and second control leads;

a diode network connected to said secondary winding, for providing output pulses when energized by said secondary winding; and a resistive network connected between said diode network and said high impedance input of the solid state power switching device, said active control means having its input connected to both said diode network and to said resistive network and its first control lead connected both to the load connection and to said diode network and its second control lead connected to said resistive network, so that, when one of the output pulses from said diode network ceases, said resistive network provides an essentially delay-free direct path from said high impedance input of said solid state power switching device to said active control means and the inherent input capacitance is discharged through said active control means and so that when each high voltage excursion ceases the interwinding capacitance is bypassed through said active control means, whereby the high impedance input of said solid state power switching device is bypassed.

25. An electronic control circuit as set forth in claim 24 further comprising means for energizing said primary winding of said transformer means with high frequency bi-directional pulses initiated in accordance with low frequency control pulses, wherein said diode network includes means connected to said secondary winding for full wave rectifying the high frequency bidirectional pulses to recover the low frequency control pulses as the output pulses.

26. An electronic control circuit as set forth in claim 24 wherein said diode network includes diode means for unidirectional conduction of current between the load connection and said secondary winding to charge the interwinding capacitance when one of the high voltage excursions occurs.

27. An electronic control circuit as set forth in claim 26 wherein said active control means has its input and its first control lead connected across said diode means for unidirectional conduction of current to prevent operation of said active control means when a high voltage excursion occurs.

28. An electronic control circuit as set forth in claim 24 wherein said diode network includes four diodes connected as a bridge rectifier across said secondary winding and having a first output connected directly to said input of said active control means and a second output connected to said resistive network.

29. An electronic control circuit as set forth in claim 24 wherein said active control means is only responsive to a predetermined voltage polarity between its input and said first control lead, and said secondary winding is coupled across said input and said second control lead of said active control means so that the pulse output is prevented from actuating said active control means and is coupled instead to said solid state power switching device.

30. An electronic control circuit as set forth in claim 24 wherein said secondary winding of said transformer means has a center tap connected to said resistive network and said secondary winding further has two ends, and said diode network includes a pair of identically poled diodes respectively connected from the two ends of said secondary winding to said input of said active control means.

31. An electronic control circuit as set forth in claim 24 further comprising clock circuit means for producing pulses having a repetition rate and means for switching the pulses at a switching rate less than the repetition rate to said primary winding in accordance with a switching waveform.

32. An electronic control circuit as set forth in claim 31 wherein said means for switching includes a pair of CMOS logic gates with outputs directly connected to opposite ends of said primary winding, said CMOS logic gates each having an input for said switching waveform and a second input connected to said clock circuit means for alternately enabling said pair of logic gates.

33. An electronic control circuit for use in electrical load powering apparatus having a load connection, a high voltage supply connection and a common, the electronic control circuit comprising:

a switching device having a high impedance input with an inherent input capacitance, said switching device also having control terminals connected between the high voltage supply connection and the load connection;

transformer means having a primary winding and a secondary winding and an inherent interwinding capacitance therebetween, said secondary winding producing an output when said primary winding is energized, said switching device being responsive to the output from said secondary winding to switch on so that the load connection is subject to a high voltage excursion relative to the common when said switching device switches on;

first and second means connected at a junction and poled serially for unidirectional conduction through either or both of said first and second means, said first means connected to the load connection and said second means connected to said secondary winding to charge the inherent interwinding capacitance when a high voltage excursion occurs at the load connection;

active control means having a first control lead connected to the load connection, a second control lead connected to the junction of said first and second means for unidirectional conduction and a third control lead connected to the high impedance input of said switching device; and means for providing an essentially delay-free path from the high impedance input of said switching device to said active control means at said second control lead so that when an output from said secondary winding ceases the inherent input capacitance of said switching device is discharged through at least two of said control leads of said active control means, turning said switching device off, and when the high voltage excursion ceases the inherent interwinding capacitance is thereby also bypassed through said active control means.

34. An electronic control circuit as set forth in claim 33 further comprising third means for unidirectional conduction connected between said second control lead of said active control means and said secondary winding in a direction opposite to a direction of discharge of the inherent interwinding capacitance.

35. An electronic control circuit as set forth in claim 34 wherein said secondary winding has a tap directly connected to said means for providing an essentially delay-free path at a point electrically distinct from said second control lead of said active control means.

36. An electronic control circuit as set forth in claim 33 wherein said means for providing an essentially delay-free path includes a passive electrical network.

37. An electronic control circuit as set forth in claim 36 further comprising third and fourth means for unidirectional conduction connected across said secondary winding, and also connected to each other at a junction connected to said passive electrical network.

38. An electronic control circuit as set forth in claim 37 further comprising fifth means for unidirectional conduction connected between said second control lead of said active control means and said secondary winding in a direction opposite to a direction of discharge of said inherent interwinding capacitance.

39. An electronic control circuit as set forth in claim 33 wherein said secondary winding is capacitively connected to said second control lead of said active control means.

40. An electronic control circuit as set forth in claim 33 further comprising clock circuit means for producing pulses having a repetition rate and means for switching the pulses at a switching rate less than the repetition rate to said primary winding in accordance with a switching waveform.

41. An electronic control circuit as set forth in claim 40 wherein said means for switching the pulses includes a pair of CMOS logic gates with outputs directly connected to opposite ends of said primary winding, said CMOS logic gates each having an input for said switching waveform and a second input connected to said clock circuit means for alternately enabling said pair of logic gates.

42. For use in electrical load powering apparatus having a load connection, a high voltage supply connection and a common, and including electronic means for switching the high voltage supply connection to the load connection, the electronic means having an input and being responsive to a voltage difference between the input and the load connection, the load connection being subject to high voltage excursions relative to the common due to the switching, an electronic control circuit comprising:
  transformer means having a primary winding and a secondary winding for providing at least one pulse output from said secondary winding, said transformer means having an inherent interwinding capacitance between said primary winding and said secondary winding;
  means connected to said secondary winding for coupling the pulse output from said secondary winding between the input of the electronic means and the load connection when the pulse output is present, a high voltage excursion on the load connection charging the inherent interwinding capacitance to a high voltage level when the pulse output is present; and
  means for bypassing the high voltage level on the inherent interwinding capacitance of said transformer means to the load connection when the pulse output and the high voltage excursion cease, to prevent the high voltage level from actuating the electronic means, said means for bypassing having an input to which said secondary winding is capacitively connected, and said means for coupling including means, connected elsewhere to said secondary winding from said input of said means for bypassing, for unidirectional conduction in a direction opposite to a direction of discharge of current from the inherent interwinding capacitance.

43. An electronic control circuit as set forth in claim 42 wherein said input of said means for bypassing is also resistively connected to said secondary winding to sense the high voltage level on the inherent interwinding capacitance.

44. An electronic control circuit as set forth in claim 42 further comprising means responsive to each high voltage excursion for temporarily disabling said means for bypassing.

45. An electronic control circuit as set forth in claim 42 further comprising clock circuit means for producing pulses having a repetition rate and means for switching the pulses at a switching rate less than the repetition rate to said primary winding in accordance with a switching waveform.

46. An electronic control circuit as set forth in claim 45 wherein said means for switching the pulses includes a pair of CMOS logic gates with outputs directly connected to opposite ends of sad primary winding, said CMOS logic gates each having an input for the switching waveform and a second input connected to said clock circuit means for alternately enabling said pair of logic gates.

47. For use in electrical load powering apparatus having a load connection, a high voltage supply connection and a common, and including electronic means for switching the high voltage supply connection to the load connection, the electronic means having an input and being responsive to a voltage difference between the input and the load connection, the load connection being subject to high voltage excursions relative to the common due to the switching, an electronic control circuit comprising:
  transformer means having a primary winding and a secondary winding for providing at least one pulse output from said secondary winding, said transformer means having an inherent interwinding capacitance between said primary winding and said secondary winding;
  a resistive network having first, second and third connections;
  full wave bridge rectification means connected across said secondary winding, said full wave bridge rectification means having an output connection to the first connection of said resistive network, the second connection of said resistive network coupling the pulse output to the input of the electronic means to provide the voltage difference when the pulse output is present, a high voltage excursion on the load connection charging the inherent interwinding capacitance through said full wave bridge rectification means to a high voltage level when the pulse output is present; and
  means for bypassing the high voltage level on the inherent interwinding capacitance of said transformer means to the load connection when the pulse output and each high voltage excursion cease, to prevent the high voltage level from actuating the electronic means for switching, said means for bypassing having an input directly connected to said full wave bridge rectification means and further having a first control lead connected to said third connection of said resistive network and a second control lead directly connected to the load connection, whereby the input of the electronic means is bypassed through said resistive network to the load connection when each high voltage excursion ceases.

48. An electronic control circuit as set forth in claim 47 wherein said means for bypassing is only responsive to a predetermined voltage polarity between its input and said second control lead and the pulse output is thereby prevented from actuating said means for bypassing and is coupled instead to the electronic means.

49. An electronic control circuit as set forth in claim 47 wherein said means for bypassing is only responsive to a predetermined voltage polarity between its input and said second control lead and further comprising unidirectional conduction means connected between the load connection and the input of said means for bypassing and poled to develop a voltage opposite to the predetermined voltage polarity when a high voltage excursion occurs.

50. An electronic control circuit as set forth in claim 47 further comprising means responsive to each high voltage excursion for temporarily disabling said means for bypassing.

51. An electronic control circuit as set forth in claim 47 further comprising clock circuit means for producing pulses having a repetition rate and means for switching the pulses at a switching rate less than the repetition rate to said primary winding in accordance with a switching waveform.

52. An electronic control circuit as set forth in claim 47 wherein said means for switching the pulses includes a pair of CMOS logic gates with outputs directly connected to opposite ends of said primary winding, said CMOS logic gates each having an input for the switching waveform and a second input connected to said clock circuit means for alternately enabling said pair of logic gates.

53. An electronic control circuit for use in electrical load powering apparatus having a load connection, a high voltage supply connection and a common, the electronic control circuit comprising:
- a solid state power switching device having a high impedance input and control terminals connected between the high voltage supply connection and the load connection;
- a transformer having a primary winding and a secondary winding for providing at least one pulse output from said secondary winding, said transformer having an inherent interwinding capacitance between said primary winding and said secondary winding;
- means connected to said secondary winding for coupling the pulse output from said secondary winding between said high impedance input of said solid state power switching device and the load connection when the pulse output is present, a high voltage excursion on the load connection charging the inherent interwinding capacitance to a high voltage level when the pulse output is present; and
- means for bypassing the high voltage level on the inherent interwinding capacitance of said transformer to the load connection when the pulse output and each high voltage excursion cease, including active control means having an input and first and second control leads and means for providing a resistive path substantially free of inductance between the input of said active control means and said high impedance input of said solid state power switching device, said active control means thereby bypassing current from said high impedance input of said solid state power switching device to the load connection through said first and second control leads, and the high voltage level being prevented from actuating said solid state power switching device when each high voltage excursion ceases.

54. An electronic control circuit as set forth in claim 53 further comprising a second solid state power switching device having an input and control terminals connected between the load connection and the common, and means connected to the input of said second solid state power switching device for actuating said second solid state power switching device.

55. An electronic control circuit as set forth in claim 54 wherein said means for actuating said second solid state power switching device includes a second transformer having a primary winding and a secondary winding for providing at least one pulse output, and means for coupling the pulse output from said secondary winding of said second transformer between said input of said second solid state power switching device and the common, the electronic control circuit further comprising clock circuit means for producing pulses having a repetition rate, and first and second means for switching the pulses at a switching rate less than the repetition rate to said primary windings of said first and second transformers in accordance with first and second switching waveforms respectively.

56. An electronically commutated motor system for use with electrical load powering apparatus having a high voltage supply connection and a common, the electronically commutated motor system comprising:
- an electronically commutated motor including a stationary assembly having a plurality of winding stages adapted to be selectively commutated, and rotatable means associated with said stationary assembly in selective magnetic coupling relation with said winding stages; and
- means for commutating said winding stages by selectively switching said winding stages at respective terminals thereof to the high voltage supply connection in response to command pulses, including:
  solid state power switching devices each having a high impedance input and control terminals connected between the high voltage supply connection and the terminals of said winding stages respectively;
  transformers respectively corresponding to each of said solid state power switching devices, each of said transformers having a primary winding and a secondary winding for providing an output from said secondary winding in response to a respective one of the command pulses, and having an inherent interwinding capacitance between said primary winding and said secondary winding;
  means connected to each said secondary winding for coupling the output from each said secondary winding between the high impedance input of each said solid state power switching device and the terminal of the winding stage to which the switching device is connected, a high voltage excursion on the terminal of any said winding stage charging the inherent interwinding capacitance of said corresponding transformer to a high voltage level when the output is present; and
  active control means each having an input and first and second control leads and means for providing resistive paths substantially free of inductance between the input of each said active control means and the high impedance input of each of said solid state power switching devices respectively, said active control means connected to bypass the high voltage level of each inherent interwinding capacitance thus charged thereby to bypass the high voltage level from the high impedance input of the corresponding solid state power switching device to the terminal of the corresponding winding stage through the first and second control leads when each high voltage excursion ceases, the high voltage level being prevented from actuating any of said solid state power switching devices when each high voltage excursion ceases.

57. An electronically commutated motor system as set forth in claim 56 further comprising additional second solid state power switching devices each having an input and control terminals connected between the terminals of the winding stages respectively and the common, and means connected to each input of said second solid state power switching devices for actuating said second solid state power switching devices.

58. An electronically commutated motor system as set forth in claim 57 wherein said means for actuating said second solid state power switching devices includes second transformers each having a primary winding and a secondary winding for providing respective outputs, and means for coupling the outputs from said secondary windings of said second transformers between the inputs respectively of said second solid state power switching devices and the common, the system further comprising clock circuit means for producing pulses having a repetition rate, and first and second means for switching the pulses at a switching rate less than the repetition rate to said primary windings of said first and second transformers in accordance with respective ones of the command pulses.

59. An electronically commutated motor system as set forth in claim 56 further comprising position sensing means for producing electrical position signals representing the position of said rotatable means, and means for generating the command pulses in response to the electrical position signals from said position sensing means.

60. An electronically commutated motor system as set forth in claim 56 further comprising means for fluid transfer driven by said electronically commutated motor.

61. An electronically commutated motor system as set forth in claim 56 further comprising heat transfer apparatus including a condenser, an evaporator connected to said condenser, and a compressor driven by said electronically commutated motor, said compressor connected to supply a refrigerant to said condenser and to receive the refrigerant from said evaporator.

62. A switching regulator power supply for use with electrical load powering apparatus having a high voltage supply connection and a common, the switching regulator power supply comprising:
a power transformer having a first winding and an output winding;
a solid state power switching device having a high impedance input and control terminals connected between the high voltage supply connection and said first winding of said power transformer, said high impedance input having an inherent input capacitance, said first winding being subject to high voltage excursions relative to the common due to the switching;
a signal transformer having a primary winding and a secondary winding for providing at least one pulse output from said secondary winding, said signal transformer having an inherent interwinding capacitance between said primary winding and said secondary winding;
means connected to said secondary winding for coupling the pulse output from said secondary winding between said high impedance input of said solid state power switching device and said first winding of said power transformer when the pulse output is present, a high voltage excursion on said first winding charging said inherent interwinding capacitance to a high voltage level when the pulse output is present; and
means for bypassing the high voltage level on the inherent interwinding capacitance of said signal transformer to said first winding of said power transformer when the pulse output and each high voltage excursion cease, including active control means having an input and first and second control leads and means for providing a resistive path substantially free of inductance between said input of said active control means and said high impedance input of said solid state power switching device, said active control means thereby bypassing current from said high impedance input of said solid state power switching device to said first winding through said first and second control leads and the high voltage level being prevented from actuating said solid state power switching device when each high voltage excursion ceases;
means connected to said output winding of said power transformer for deriving an output voltage of the switching regulator power supply;
means for detecting a difference between the output voltage and a predetermined value to which the output voltage is to be regulated; and
means for generating a pulse width modulated series of pulses for energizing the primary winding of said signal transformer as a function of the difference so detected to reduce the difference detected.

63. A switching regulator power supply as set forth in claim 62 further comprising a second solid state power switching device having an input and control terminals connected between said first winding of said power transformer and the common and means connected to said input of said second solid state power switching device for actuating said second solid state power switching device in response to said means for generating the pulse width modulated series of pulses.

64. A switching regulator power supply as set forth in claim 63 wherein said means for actuating said second solid state power switching device includes a second signal transformer having a primary winding and a secondary winding for providing at least one pulse output, and means for coupling the pulse output from said secondary winding of said second signal transformer between said input of said second solid state power switching device and the common, the switching regulator power supply further comprising clock circuit means for producing pulses having a repetition rate, and first and second means for switching the pulses at a switching rate established by the pulse width modulated series of pulses to said primary windings of said first and second signal transformers, said repetition rate exceeding the switching rate.

65. A control method for use in electrical load powering apparatus having a load connection, a high voltage supply connection and a common, and including electronic means for switching the high voltage supply connection to the load connection, the electronic means having an input and being responsive to a voltage difference between the input and the load connection, the load connection being subject to high voltage excursions relative to the common due to the switching, the control method comprising the steps of:

producing at least one pulse output from a secondary winding of a transformer having a primary winding and a secondary winding and an inherent interwinding capacitance between the primary winding and the secondary winding;

coupling the pulse output from the secondary winding between the input of the electronic means and the load connection when the pulse output is present, a high voltage excursion on the load connection charging the inherent interwinding capacitance to a high voltage level when the pulse output is present; and providing an electrical signal substantially free of inductive delay from the input of the electronic means to an active control means so that the active control means bypasses current from the input of the electronic means to the load connection and the high voltage level is prevented from actuating the electronic means when each high voltage excursion ceases.

66. A control method for use in electrical load powering apparatus having a load connection, a high voltage supply connection and a common, and including electronic means for switching the high voltage supply connection to the load connection, the electronic means having a high impedance input with an inherent input capacitance and the electronic means being responsive to a voltage difference between the high impedance input and the load connection, the load connection being subject to high voltage excursions relative to the common due to the switching, the control method comprising the steps of:

producing a bipolar pulse output from a transformer having a primary winding and a secondary winding and an inherent interwinding capacitance between the primary winding and the secondary winding;

processing the bipolar pulse output through a diode network to produce an electrical control signal;

resistively coupling the electrical control signal from the diode network to the high impedance input of the electronic means for switching, thereby charging its inherent input capacitance and switching on, a high voltage excursion on the load connection charging the inherent interwinding capacitance of the transformer to a high voltage level;

discharging the inherent input capacitance substantially free of inductive delay when the bipolar pulse output from the transformer ceases; and bypassing the high voltage level on the inherent interwinding capacitance to the load connection when each high voltage excursion ceases, whereby the high impedance input of the electronic means is bypassed when each high voltage excursion ceases.

67. A method of operating an electronically commutated motor including a stationary assembly having a plurality of winding stages adapted to be selectively commutated, and rotatable means associated with the stationary assembly in selective magnetic coupling relation with the winding stages, for use with electrical load powering apparatus having a high voltage supply connection and a common, the method comprising the steps of:

commutating the winding stages by selectively switching the winding stages at respective terminals thereof to the high voltage connection with high impedance input solid state switching devices in response to pulses, each high impedance input having an inherent input capacitance;

producing the pulses rectified from transformers having a primary winding and a secondary winding and an inherent interwinding capacitance between the primary winding and the secondary winding, a high voltage excursion due to the switching on the terminal of any winding stage charging the inherent interwinding capacitance of a corresponding transformer to a high voltage level;

discharging each inherent input capacitance substantially free of inductive delay when each pulse so rectified ceases; and bypassing each inherent interwinding capacitance thus charged to the terminal of the corresponding winding stage to avoid actuating the high impedance input of each corresponding solid state switching device when each high voltage excursion ceases.

* * * * *